United States Patent
Yoshida et al.

(10) Patent No.: US 12,456,695 B2
(45) Date of Patent: Oct. 28, 2025

(54) SEMICONDUCTOR APPARATUS AND MANUFACTURING METHOD FOR SEMICONDUCTOR APPARATUS

(71) Applicant: FUJI ELECTRIC CO., LTD., Kawasaki (JP)

(72) Inventors: Daiki Yoshida, Matsumoto (JP); Nobuhiro Higashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 619 days.

(21) Appl. No.: 17/851,405

(22) Filed: Jun. 28, 2022

(65) Prior Publication Data
US 2023/0063723 A1   Mar. 2, 2023

(30) Foreign Application Priority Data
Aug. 26, 2021   (JP) ................. 2021-137733

(51) Int. Cl.
*H01L 23/00*   (2006.01)
*H01L 21/48*   (2006.01)
*H01L 23/50*   (2006.01)

(52) U.S. Cl.
CPC ........ *H01L 23/562* (2013.01); *H01L 21/4814* (2013.01); *H01L 23/50* (2013.01)

(58) Field of Classification Search
CPC ......... H01L 23/49811; H01L 23/49838; H01L 23/49844; H01L 23/50; H01L 23/562; H01L 25/072
See application file for complete search history.

(56) References Cited

U.S. PATENT DOCUMENTS

| | | | |
|---|---|---|---|
| 2006/0244116 A1* | 11/2006 | Tsunoda | ............... H01L 24/37 257/E21.515 |
| 2008/0001278 A1 | 1/2008 | Matsumoto | |
| 2015/0061098 A1 | 3/2015 | Imoto et al. | |

FOREIGN PATENT DOCUMENTS

| | | |
|---|---|---|
| JP | 2008010656 A | 1/2008 |
| JP | 2015046416 A | 3/2015 |

* cited by examiner

*Primary Examiner* — Reema Patel

(57) ABSTRACT

A semiconductor apparatus includes: (i) a semiconductor device; (ii) a first external connection terminal configured to be connected to the semiconductor device, and includes a first surface; and a second surface; and (iii) an insulating resin enclosure. The first external connection terminal includes: a base part that is embedded in the insulating resin enclosure; and a protruding part that protrudes from the inner wall of the insulating resin enclosure. The second surface includes: a first part that corresponds to the protruding part; and a second part that corresponds to the base part and is exposed by the first recessed part. The first part and the second part are continuous with each other along a second direction. The first and second extending parts are spaced apart from each other in a third direction. Each of the first and second extending parts extends along the first direction from a position corresponding to the second surface of the first external connection terminal.

18 Claims, 23 Drawing Sheets

FIG. 5
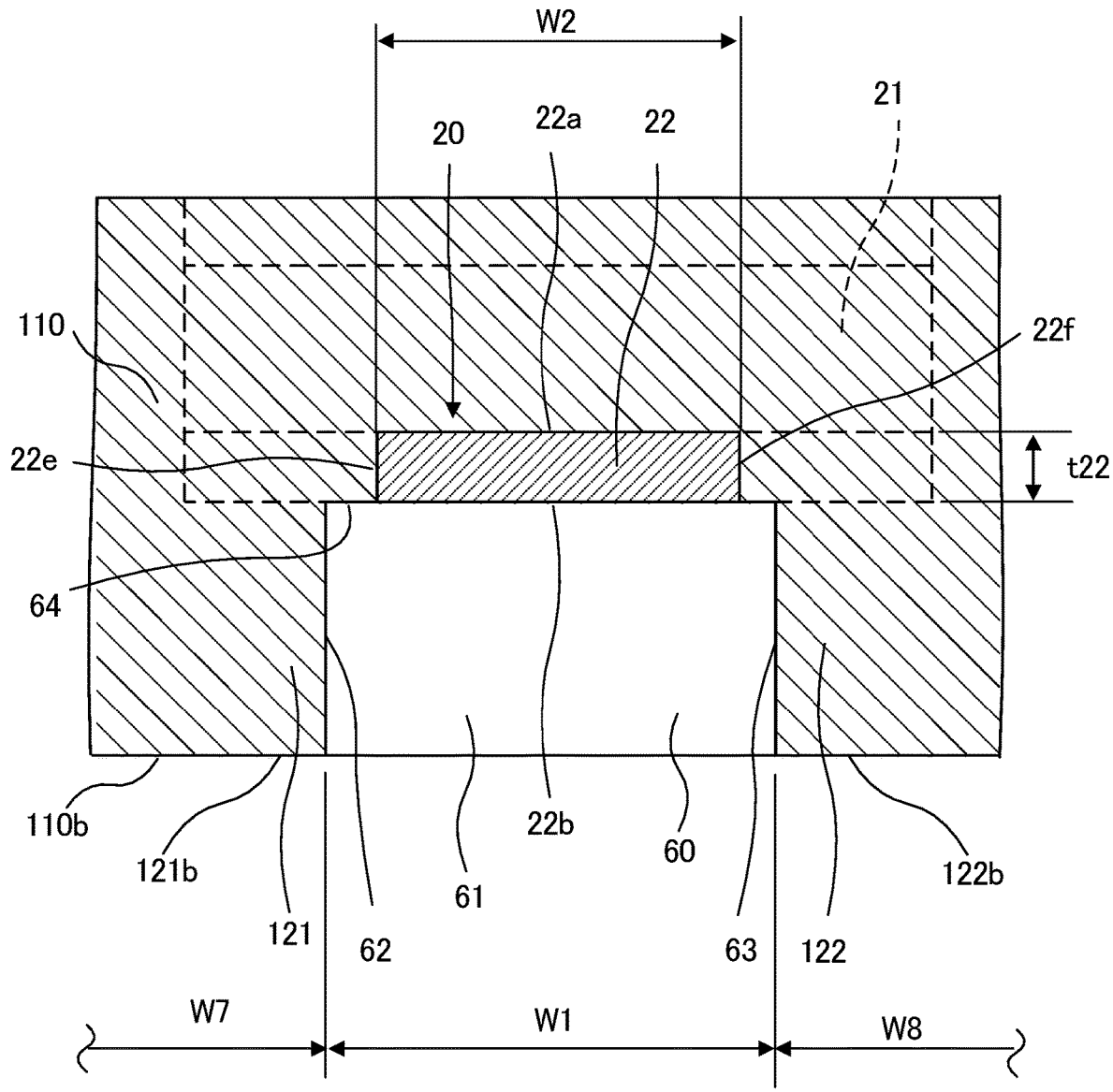
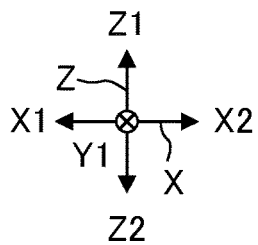

SEMICONDUCTOR APPARATUS AND MANUFACTURING METHOD FOR SEMICONDUCTOR APPARATUS

CROSS REFERENCE TO RELATED APPLICATION

This Application claims priority from Japanese Patent Application No. 2021-137733, filed Aug. 26, 2021, the entire content of which is incorporated herein by reference.

BACKGROUND

Field of the Invention

The present disclosure relates to semiconductor apparatuses and to manufacturing methods for semiconductor apparatus.

Description of Related Art

In Japanese Patent Applications, Laid-Open Publications Nos. 2015-46416 and 2008-10656, a semiconductor apparatus includes a semiconductor device provided on a substrate, an enclosure that houses the semiconductor device, and a lead terminal integrated with the enclosure and connected to the semiconductor device.

For example, a conductive part including semiconductor devices provided on the substrate is assembled with an enclosure. At this time, a stress acts on the enclosure. This stress causes a reaction force (load) to act on a lead terminal of the conductive part, and this reaction force causes a stress to act on a supporting portion of the enclosure that supports the lead terminal. There is a need to increase the size of the enclosure when the reaction force from the lead terminal is large.

SUMMARY

The present disclosure provides a semiconductor apparatus that decreases the rigidity of an external connection terminal and suppresses the increase in size of an enclosure, and a manufacturing method for the semiconductor apparatus.

A semiconductor apparatus according to this disclosure includes: a semiconductor device; a first external connection terminal configured to be connected to the semiconductor device, the first external connection terminal including a first surface and a second surface opposing the first surface; and an insulating resin enclosure including: an inner wall that defines a space for housing the semiconductor device and is along a first direction that is directed from the first surface to the second surface, a first recessed part that exposes the second surface of the first external connection terminal, a first extending part that defines the recessed part, and a second extending part that defines the first recessed part and is spaced apart from the first extending part along a third direction that is along a width direction of the first external connection terminal, in which: the first external connection terminal includes: a base part that is embedded in the insulating resin enclosure; and a protruding part that protrudes from the inner wall of the insulating resin enclosure, the second surface of the first external connection terminal includes: a first part that corresponds to the protruding part; and a second part that corresponds to the base part and is exposed by the first recessed part, the first part and the second part are continuous with each other along a second direction in which the protruding part of the first external connection terminal protrudes, the first and second extending parts are spaced apart from each other in the third direction, and each of the first and second extending parts extends along the first direction from a position corresponding to the second surface of the first external connection terminal.

The manufacturing method according to the present disclosure relates to a method for manufacturing the foregoing semiconductor apparatus.

The manufacturing method includes: disposing the first external connection terminal in a molding die having a convex portion opposing the first recessed part, and filling the molding die with insulating resin, to mold the insulating resin enclosure in which the base part of the first external connection terminal is embedded and the first recessed part is formed, using mold-forming; providing a gap between the first external connection terminal and a component part to be joined thereto in the first direction; disposing the first external connection terminal and the component part in the insulating resin enclosure; and joining the first external connection terminal and the component part together in a state in which the first external connection terminal is pressed against the component part.

BRIEF DESCRIPTION OF THE DRAWINGS

FIG. 5 is a cross-sectional view of a second piece of the external connection terminal taken along line V-V shown in FIG. 4.

DESCRIPTION OF THE EMBODIMENTS

Figure 1:
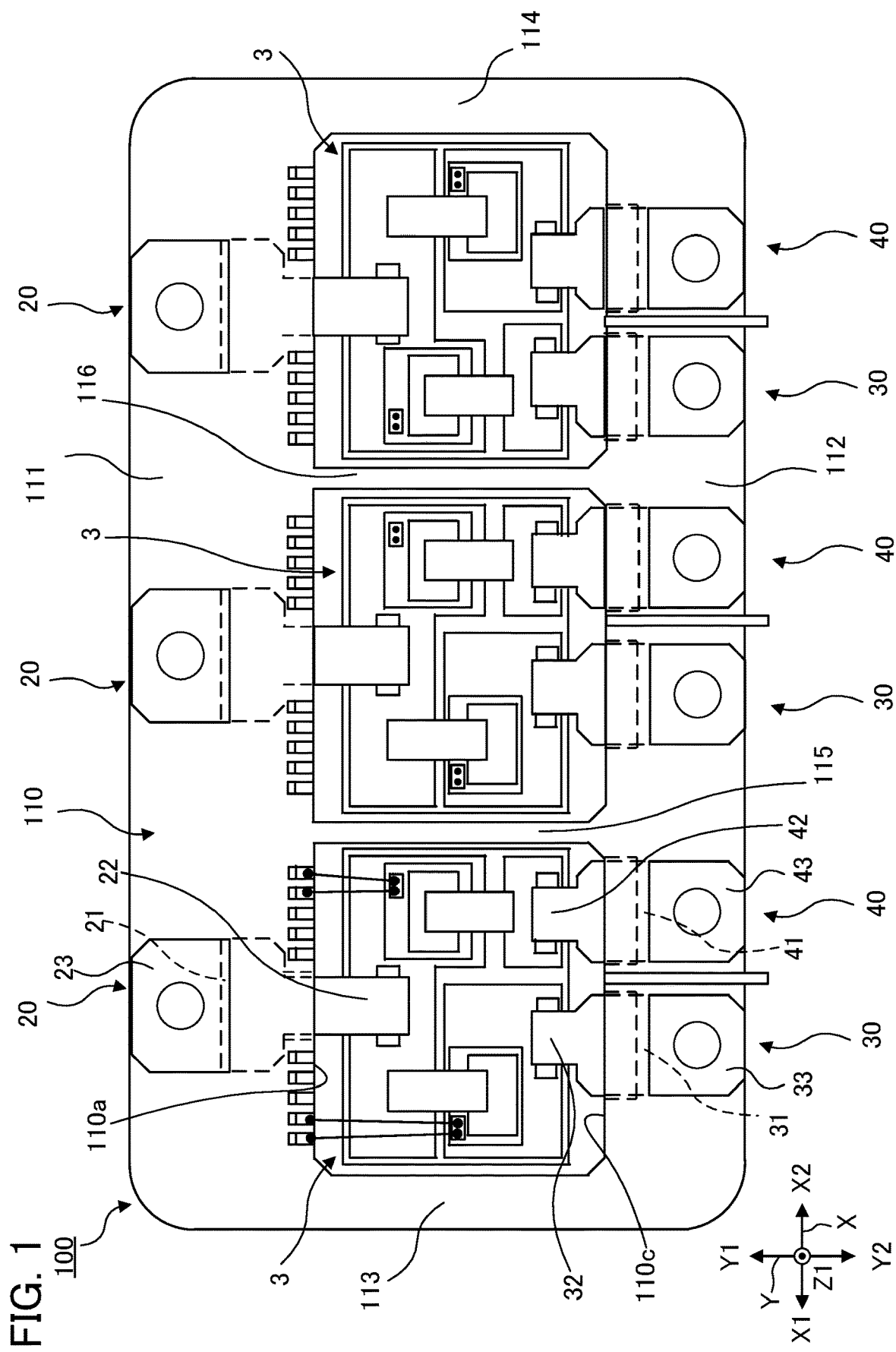
FIG. 1 is a plan view illustrating a semiconductor package according to a first embodiment.

Embodiments of the present disclosure will be described below with reference to the drawings. Dimensions and scales of parts differ, as appropriate, from actual dimensions and scales in the drawings. The embodiments described below are suitable specific examples of the present disclosure. For this reason, in the present embodiments, various limitations that are technically preferred are applied. However, the scope of the present disclosure is not limited to these forms as long as there are no particular descriptions that limit the present disclosure in the description below.

First Embodiment

Figure 2:
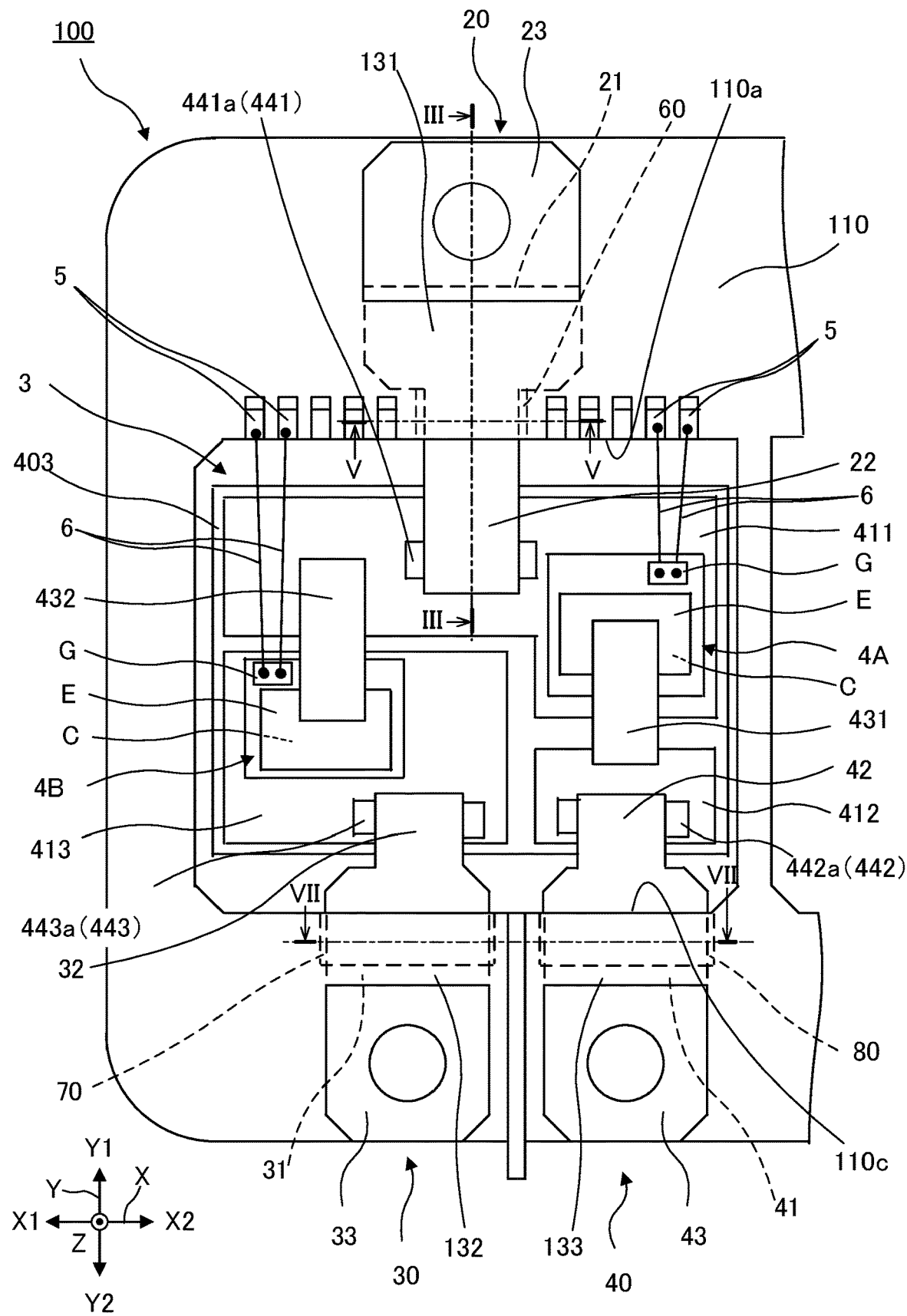
FIG. 2 is a plan view illustrating a part of the semiconductor package.
Figure 3:
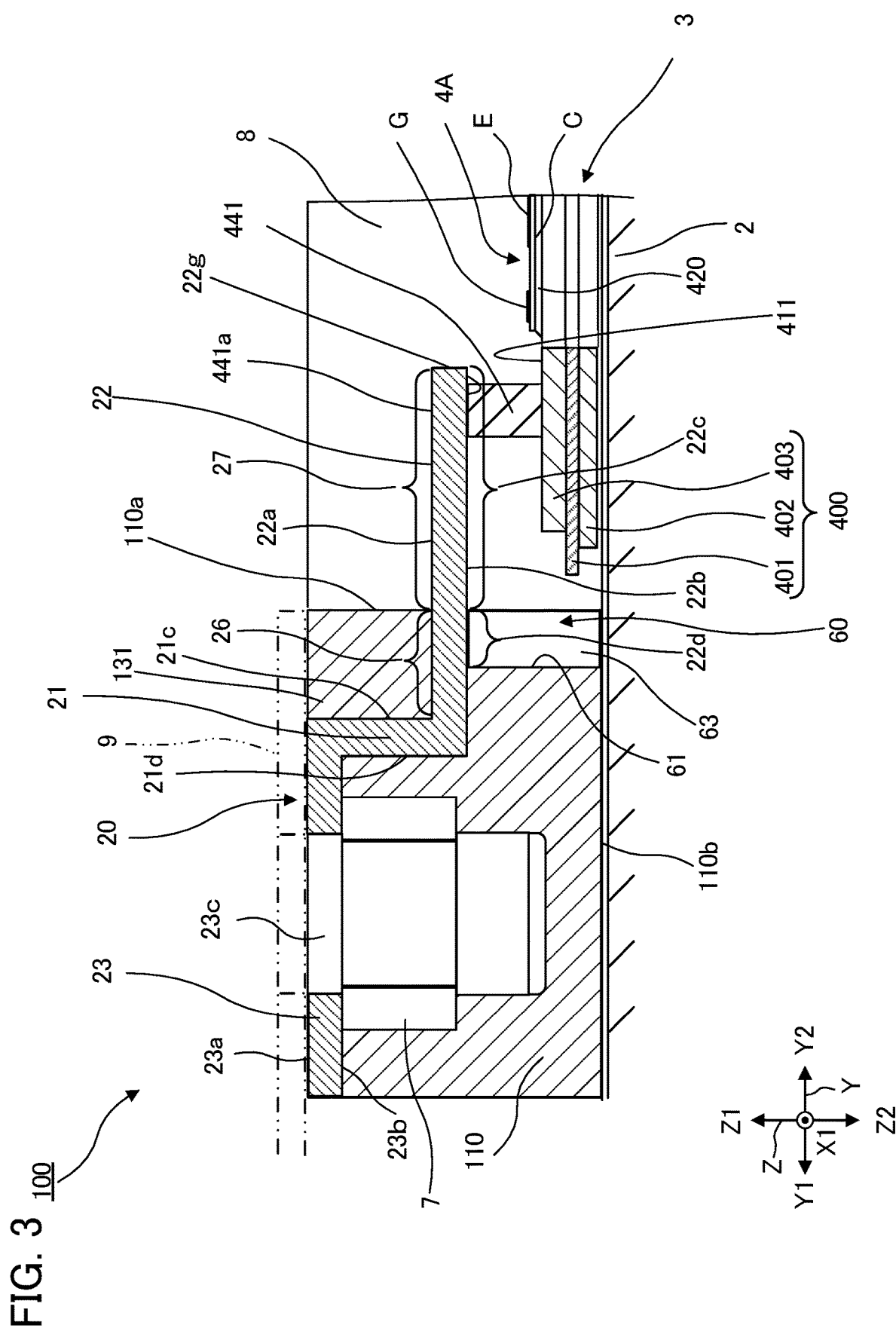
FIG. 3 is a cross-sectional view illustrating a part of the semiconductor package taken along line III-III shown in FIG. 2.

FIG. 1 is a plan view illustrating a semiconductor package 100 according to a first embodiment. FIG. 2 is a plan view illustrating a part of the semiconductor package 100. FIG. 3 is a cross-sectional view illustrating a part of the semiconductor package 100 taken along line III-III shown in FIG. 2. In FIG. 3, a part of an external connection terminal 20 is embedded in an enclosure 110.

In each drawing, an X-axis direction, a Y-axis direction, and a Z-axis direction are orthogonal to each other. The Z2 direction is along the Z-axis and is one example of a first direction. The Z1 direction is opposite to the Z2 direction. The Y2 direction is along the Y-axis and is one example of a second direction. The Y1 direction is opposite to the Y2 direction. The X2 direction is along the X-axis and is one example of a third direction. The X1 direction is opposite to the X2 direction. The XY plane is parallel to the X-axis and the Y-axis. The XZ plane is parallel to the X-axis and the Z-axis. The YZ plane is parallel to the Y-axis and the Z-axis.

As illustrated in FIGS. 1 and 2, the semiconductor package 100 includes an enclosure 110, external connection terminals 20, 30 and 40, and semiconductor units 3. The semiconductor package 100 is one example of a semiconductor apparatus, and it is a power semiconductor package. It may be a semiconductor module. The semiconductor package 100 includes the semiconductor units 3 arranged side by side in the X2 direction. The external connection terminals 20, 30 and 40 are provided for the respective semiconductor units 3.

The enclosure 110 is formed by a resin material having insulating properties. The enclosure 110 is one example of an "insulating resin enclosure," and it defines a space of each of the semiconductor devices (semiconductor chips). The resin material is a thermoplastic resin, for example. Examples of the resin material of the enclosure 110 include PBT and PPS. PBT is an abbreviation for polybutylene terephthalate. PPS is an abbreviation for polyphenylene sulfide.

The enclosure 110 is formed so as to surround each of the semiconductor units 3 when seen in the Z2 direction. The enclosure 110 is, for example, rectangular when seen in the Z2 direction. The enclosure 110 has a predetermined thickness along the Z2 direction. The enclosure 110 includes parts 111 to 114. The parts 111 and 112 are apart from each other in the Y2 direction and extend in the X2 direction. The parts 113 and 114 are apart from each other in the X2 direction and extend in the Y2 direction. The enclosure 110 includes parts 115, 116. The parts 115 and 116 are apart from each other in the X2 direction between the parts 113 and 114, and extend in the Y2 direction. The semiconductor units 3 are disposed in (i) a region surrounded by the parts 111, 112, 113 and 115, (ii) a region surrounded by the parts 111, 112, 115 and 116, and (iii) a region surrounded by the parts 111, 112, 114 and 116. The enclosure 110 houses the semiconductor units 3.

As illustrated in FIG. 3, the external connection terminal 20 is integrated with the enclosure 110, and is one example of an external connection terminal. A part of the external connection terminal 20 is embedded in the enclosure 110. One end of the external connection terminal 20 is extended into a region surrounded by the enclosure 110 and is electrically connected to the semiconductor unit 3. Other ends of the external connection terminals 20, 30, 40 are extended to the outside from the enclosure 110 and are connected to an external terminal (external wiring) 9 illustrated by two broken lines. Here, the external connection terminal 30 is one example of a second external connection terminal. The external connection terminal 40 is one example of a third external connection terminal.

The external connection terminal 20 is configured to be electrically connected to the semiconductor unit 3 and the external terminal 9. The external connection terminal 20 is formed by a metal material having electrical conductivity (e.g., copper or aluminum). The surface may be covered with nickel or tin. The shape and the like of the external connection terminal 20 are described below. The external connection terminals 30 and 40 have configurations similar to that of the external connection terminals 20. The description of the external connection terminals 30 and 40 may be partially omitted.

The external terminal 9 is connected to the other end of the external connection terminal 20. In FIG. 3, the external terminal 9 is illustrated by two-dot chain lines. The external terminal 9 is formed by a metal material having excellent electrical conductivity such as copper or aluminum. The surface may be covered with nickel or tin. The external terminal 9 may be a metal plate such as a busbar.

As illustrated in FIG. 2, the semiconductor unit 3 includes a laminated substrate 400, and semiconductor chips 4A and 4B. The laminated substrate 400 is a substrate on which the semiconductor chips 4A and 4B are mounted. The plate thickness direction of the laminated substrate 400 is along the Z2 direction. The laminated substrate 400 may be a laminated ceramic substrate such as a direct copper bonding (DCB) substrate or an active metal brazing (AMB) substrate, for example. As illustrated in FIG. 3, the laminated substrate 400 has an insulating layer 401 and metal layers 402, 403. The insulating layer 401 is a ceramic plate, and it may be a resin insulating layer. The plate thickness direction of the insulating layer 401 is along the Z2 direction. The metal layers 402 and 403 are provided on both surfaces of the insulating layer 401, and face each other in the Z2 direction across the insulating layer 401. The metal layers 402 and 403 may be metal plates adhering to the insulating layer 401. The metal layers 402 and 403 are made of metal of which electrical conductivity and thermal conductivity are high (e.g., copper or aluminum). The metal layers 402 and 403 are electrically conducting layers.

The metal layer 402 is disposed below the insulating layer 401. The metal layer 403 is disposed above the insulating layer 401. The insulating layer 401 is disposed so as to be in contact with a cooling device 2 described below. As illustrated in FIG. 2, electric conductor patterns 411, 412 and 413 are formed on the metal layer 403, and are electrically conducting films. The electric conductor patterns 411, 412 and 413 are formed by an electrically conducting material with low resistance (e.g., copper or copper alloy).

The semiconductor chips 4A and 4B are power semiconductor devices that switch high current, and are one example of a semiconductor device. Examples of each of the semiconductor chips 4A and 4B include transistors such as an insulated gate bipolar transistor (IGBT), a metal-oxide-semiconductor field-effect transistor (MOSFET), a reverse conducting IGBT (RC-IGBT) and a freewheeling diode (FWD). In an example of the first embodiment, the semiconductor chip 4 is an RC-IGBT including an IGBT and an FWD.

The semiconductor chips 4A and 4B each include a main electrode E, a main electrode C, and a control electrode G. The main electrodes E and C are electrodes to or from which current to be controlled is input or output. The main electrode E is an emitter electrode formed on an upper surface of each of the semiconductor chips 4A and 4B. The main electrode C is a collector electrode formed on a lower surface of each of the semiconductor chips 4A and 4B. The main electrode C also functions as an anode electrode of an FWD, and the main electrode E also functions as a cathode electrode of the FWD.

The control electrode G is a gate electrode. The control electrode G is formed on the upper surface of each of the semiconductor chips 4A and 4B, and is applied to voltage for controlling the turning on or off of each of the semiconductor chips 4A and 4B. The control electrode G may include a detection electrode for current detection and temperature detection.

As illustrated in FIG. 3, for example, the semiconductor chip 4A is joined to the laminated substrate 400 with use of a joining material 420 such as solder. The semiconductor chip 4B is also joined to the laminated substrate 400 with use of the joining material 420 in a similar manner. The main electrode C of the semiconductor chip 4A is formed on a bottom surface of the semiconductor chip 4A. The main electrode C of the semiconductor chip 4A is joined to the electric conductor pattern 411 opposing the main electrode C in the Z2 direction. The main electrode C of the semiconductor chip 4B illustrated in FIG. 2 is formed on the bottom surface of the semiconductor chip 4B. The main electrode C of the semiconductor chip 4B is joined to the electric conductor pattern 413 opposing the main electrode C in the Z2 direction.

The semiconductor unit 3 includes internal wiring 431 and 432. The internal wiring 431 electrically connects the main electrode E of the semiconductor chip 4A and the electric conductor pattern 412 to each other. The internal wiring 432 electrically connects the main electrode E of the semiconductor chip 4B and the electric conductor pattern 411 to each other. The internal wiring 431 and 432 may be plate-shaped lead frames, and are formed from an electrically conducting material with low resistance such as copper or copper alloy. The internal wiring 431, 432 are not limited to lead frames and may be wires or ribbons.

The semiconductor unit 3 includes internal connection terminals 441, 442 and 443. The internal connection terminals 441, 442 and 443 are formed by an electrically conducting material with low resistance such as copper or copper alloy. They are block bodies, such as rectangular columns and cylinders. They may be spacers. The internal connection terminal 441 is electrically connected to the electric conductor pattern 411. The internal connection terminal 442 is joined to the electric conductor pattern 412. The internal connection terminal 443 is joined to the electric conductor pattern 413. As illustrated in FIG. 3, the internal connection terminal 441 is disposed so as to extend upward from the electric conductor pattern 411. Similarly, the internal connection terminals 442, 443 are disposed so as to extend upward from the electric conductor patterns 412 and 413.

The internal connection terminals 441, 442 and 443 includes top surfaces 441a, 442a, and 443a, respectively. The top surfaces 441a, 442a and 443a are on the upper sides of the internal connection terminals 441, 442 and 443, respectively. The top surfaces 441a, 442a and 443a are disposed apart from the electric conductor patterns 411, 412 and 413, respectively, in the Z2 direction. The top surfaces 441a, 442a and 443a include surfaces joined to the external connection terminals 20, 30 and 40, respectively.

As illustrated in FIG. 2, the semiconductor package 100 includes control terminals 5. The control terminals 5 are provided in the enclosure 110. The control terminals 5 are lead terminals, and are electrically connected to the control electrodes G of the semiconductor chips 4A and 4B by wires 6. The control terminals 5 are integrally formed with the enclosure 110 by insert molding, for example.

Figure 4:
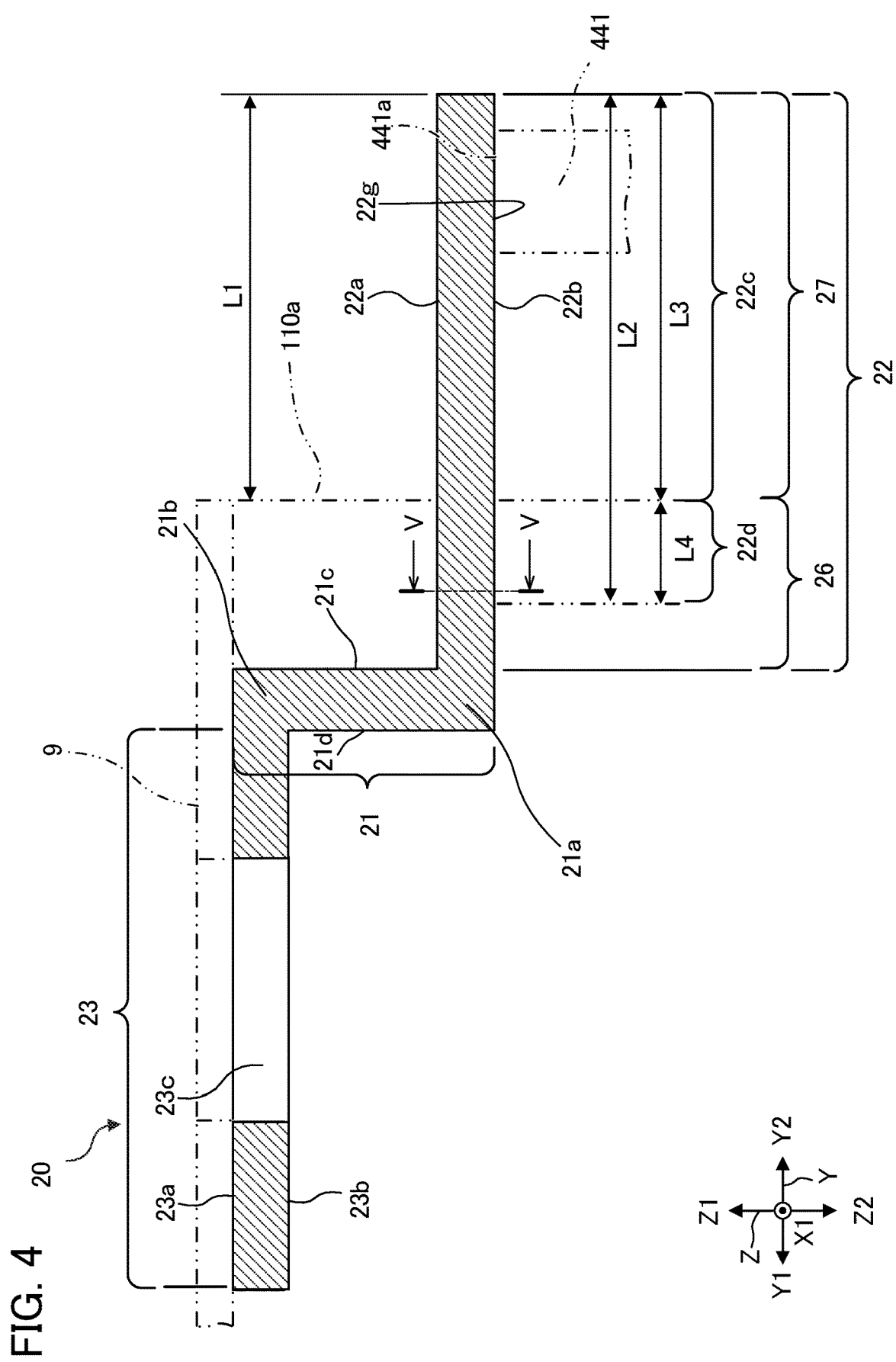
FIG. 4 is a cross-sectional view illustrating an external connection terminal shown in FIG. 3.

Next, the external connection terminals 20 will be described. FIG. 4 is a cross-sectional illustrating the external connection terminal 20. In FIG. 4, a cross-section taken along a YZ plane is illustrated. The external connection terminal 20 is plate-shaped, and is formed by a metal plate. The external connection terminals 20 is molded by press working, for example. The external connection terminal 20 includes a first piece 21, a second piece 22, and a third piece 23. The external connection terminal 20 has a crank structure. The crank structure includes the first piece 21, the second piece 22, and the third piece 23. The crank structure is formed by bending a plate member. The first piece 21 is positioned between the second piece 22 and the third piece 23. The external connection terminal 20 is not limited to a plate shape.

The plate thickness direction of the first piece 21 is along the Y2 direction. The first piece 21 extends in the Z2 direction and couples the second piece 22 and the third piece 23 to each other. The plate thickness direction of the second piece 22 is along the Z2 direction. The second piece 22 extends from a lower end 21a of the first piece 21 along the Y2 direction. The first pieces 21 and 22 of the external connection terminal 20 are L-shaped overall when seen from the X2 direction (the opposite of the X1 direction). The plate thickness direction of the third piece 23 is along the Z2 direction. The third piece 23 extends from an upper end 21b of the first piece 21 along the Y1 direction. The first piece 21 and the third piece 23 of the external connection terminal 20 are L-shaped overall when seen from the X2 direction. The second piece 22 and the third piece 23 are disposed in different positions in the Z2 direction and extend in opposite directions from each other.

The third piece 23 is electrically connected to the external terminal 9. The third piece 23 includes a first surface 23a and a second surface 23b opposing each other in the Z2 direction. The second surface 23b is a surface on the lower side and is embedded in the enclosure 110. The first surface 23a is a surface on the upper side and is exposed to the outside of the enclosure 110. The first surface 23a includes a surface electrically connected to the external terminal 9. The external terminal 9 is a busbar, for example. In FIG. 4, the external terminal 9 is illustrated by two-dot chain lines. In the third piece 23, an opening 23c that passes therethrough along the Z2 direction is provided. As illustrated in FIG. 3, in the enclosure 110, a nut 7 is embedded in a position corresponding to the opening 23c. A screw (not shown) is inserted into the opening 23c, and it is mounted in the nut 7. The external terminal 9 is fixed by the screw and is fastened to the third piece 23. The external terminal 9 is pressed against the third piece 23 in the Z2 direction, thereby being fixed to the enclosure 110 and being electrically connected to the external connection terminal 20.

The first piece 21 includes a first surface 21c, and a second surface 21d opposing the first surface 21c in the Y1 direction. The first surface 21c is closer to the second piece 22 (a protruding part 27) than the second surface 21d in the Y2 direction. When seen in the X2 direction (the opposite to the X1 direction), the first piece 21 may be inclined to the Z-axis. The first piece 21 may be inclined to the second piece 22 at an angle of 90 degrees or more. The first piece 21 is embedded in the enclosure 110 and extends along the Z2 direction. The first surface 21c and the second surface 21d of the first piece 21 are embedded in the enclosure 110.

The second piece 22 includes a connection surface 22g electrically connected to the semiconductor chip 4A. The second piece 22 includes a first surface 22a and a second surface 22b opposing the first surface 22a in the Z2 direction. The first surface 22a is a surface on the upper side, and the second surface 22b is a surface on the lower side. The second surface 22b of the second piece 22 is joined to a top surface 441a of the internal connection terminal 441. The joining of the second piece 22 of the external connection terminal 20 and the internal connection terminal 441 is described below. Out of the second surface 22b of the second piece 22, a surface joined to the top surface 441a of the internal connection terminal 441 is the connection surface 22g.

A part of the external connection terminal 20 is embedded in the enclosure 110. A part of the second piece 22 is embedded in the enclosure 110, and a part of the second piece 22 protrudes from the enclosure 110.

Figure 6:
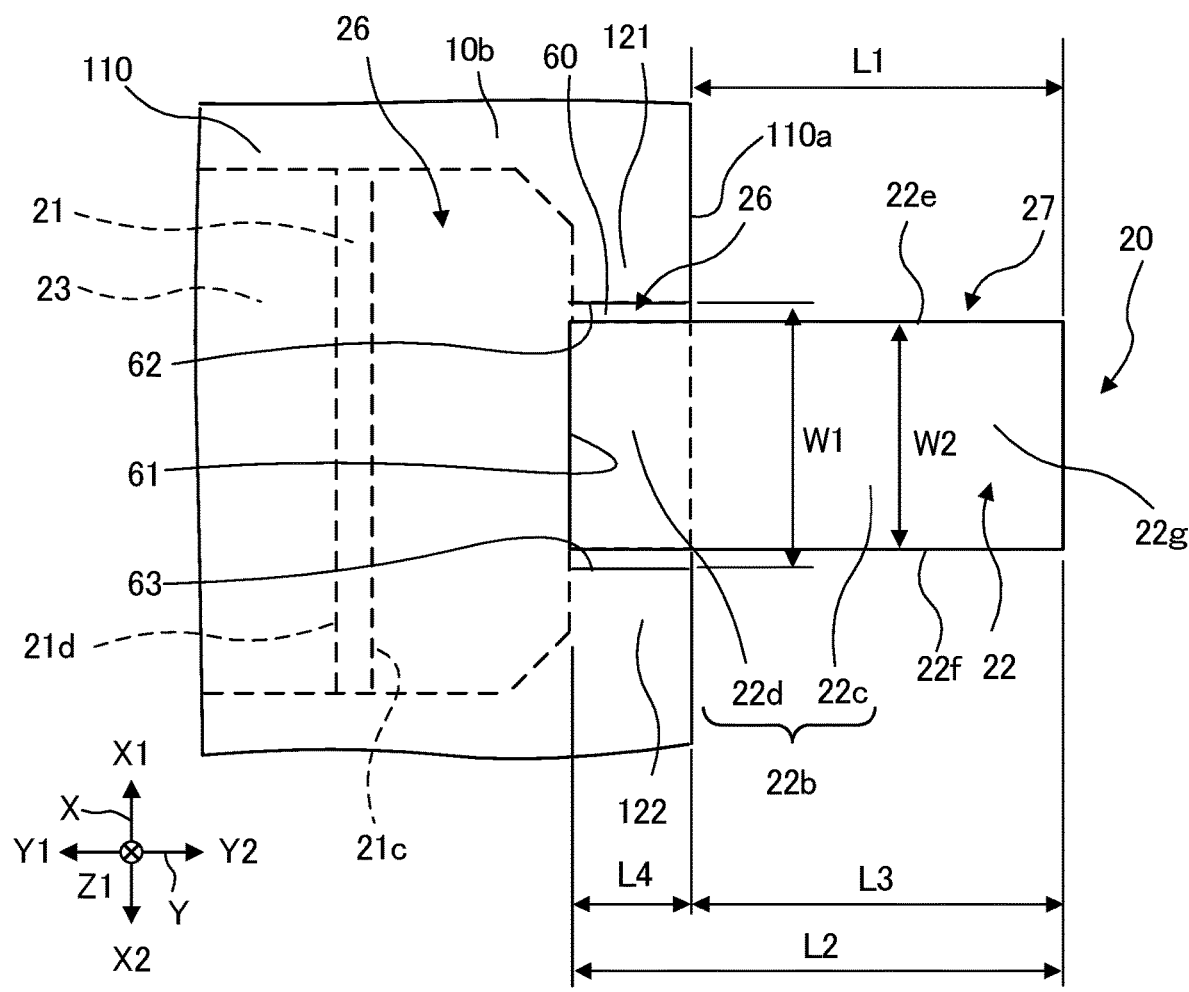
FIG. 6 is a bottom view illustrating a part of the enclosure and shows a recessed part that exposes a second surface of the second piece of the external connection terminal.

FIG. 5 is a cross-sectional view of the second piece 22 of the external connection terminal 20 taken along line V-V shown in FIG. 4. FIG. 6 is a bottom view illustrating a part of the enclosure 110 and shows a recessed part 60 that exposes the second surface 22b of the second piece 22 of the external connection terminal 20.

As illustrated in FIGS. 4 and 6, the second piece 22 of the external connection terminal 20 includes a base part 26 embedded in the enclosure 110, and a protruding part 27 that protrudes from an inner wall 110a of the enclosure 110 in the Y2 direction. The inner wall 110a is a surface that separates a space inside the enclosure 110, that is, a space for housing the semiconductor unit 3, and it intersects with the Y-axis. That is, the inner wall 110a defines a space for housing a semiconductor device (semiconductor chip) and is along the Z2 direction (a direction that is directed from the first surface 22a to the second surface 22b of the external connection terminal 20). The inner wall 110a may be a surface closest to the semiconductor unit 3 between the inner walls 110a and 110c of the enclosure 110 in the Y2 direction. The base part 26 is positioned between the first piece 21 and the protruding part 27 in the Y2 direction. The base part 26 is positioned on the inner side (the Y1 direction) of the inner wall 110a. The protruding part 27 is positioned on the outer side (the Y2 direction) of the inner wall 110a. In the Y2 direction, the position of a boundary between the base part 26 and the protruding part 27 corresponds to the position of the inner wall 110a.

The part out of the second piece 22 that is embedded in the enclosure 110 corresponds to a part on the inner side of the inner wall 110a. In the part embedded in the enclosure 110, at least one surface out of the first surface 22a and the second surface 22b is embedded in the enclosure 110.

Next, the recessed part 60 and extending parts 121 and 122 of the enclosure 110 will be described. As illustrated in FIGS. 3, 5 and 6, the recessed part 60 is formed in the enclosure 110. The recessed part 60 is one example of a first recessed part. As illustrated in FIGS. 5 and 6, the recessed part 60 is formed between the extending parts 121 and 122 in the X2 direction. In other words, the extending parts 121 and 122 are disposed on the outer sides of the recessed part 60 in the X2 direction. The extending part 121 is one example of an extending part that defines the recessed part 60. The extending part 122 is one example of an extending part that defines the recessed part 60 and is spaced apart from the extending part 121 along the X2 direction (a width direction of the external connection terminal 20). As shown in FIG. 6, the recessed part 60 is formed so as to be depressed from the inner wall 110a in the Y1 direction. As illustrated in FIGS. 3 and 6, the recessed part 60 exposes a second part 22d of the second surface 22b. The second surface 22b includes a first part 22c and the second part 22d. The recessed part 60 is formed such that the first part 22c and the second part 22d are continuous with each other along the Y2 direction (a direction in which the protruding part 27 is protruded). As illustrated in FIG. 3, the recessed part 60 is formed so as to be depressed from a bottom surface 110b of the enclosure 110 in the Z1 direction. The bottom surface 110b is a surface on the lower side of the enclosure 110. The expression "exposed" means a state of not being covered with the enclosure 110. For example, as described below, when a sealing part 8 is formed in the recessed part 60, the sealing part 8 is exposed.

The recessed part 60 is defined by wall surfaces 61 to 64 of the enclosure 110. As illustrated in FIG. 3, the wall surface 61 intersects with the Y-axis. The wall surface 61 is positioned apart from the inner wall 110a along the Y1 direction. The wall surface 61 is positioned between the second surface 21d of the first piece 21 and the inner wall 110a, and in particular, it is in an intermediate position of the base part 26 in the Y2 direction. The wall surface 61 is one example of a wall surface of the enclosure 110 that defines the recessed part 60 in the Y2 direction. The wall surface 61 is closer to the protruding part 27 than the second surface 21d of the first piece 21.

As illustrated in FIGS. 5 and 6, wall surfaces 62 and 63 are spaced apart from each other along the X2 direction. The wall surface 62 is spaced apart from a side surface 22e of the second piece 22 in the X1 direction, and the wall surface 63 is spaced apart from a side surface 22f of the second piece 22 in the X2 direction. The side surface 22f opposes the side surface 22e. The wall surfaces 62 and 63 intersect with the X-axis. The side surfaces 22e and 22f are covered with resin of the enclosure 110. The side surfaces 22e and 22f may not be in contact with the resin of the enclosure 110 as described below.

Figure 24:
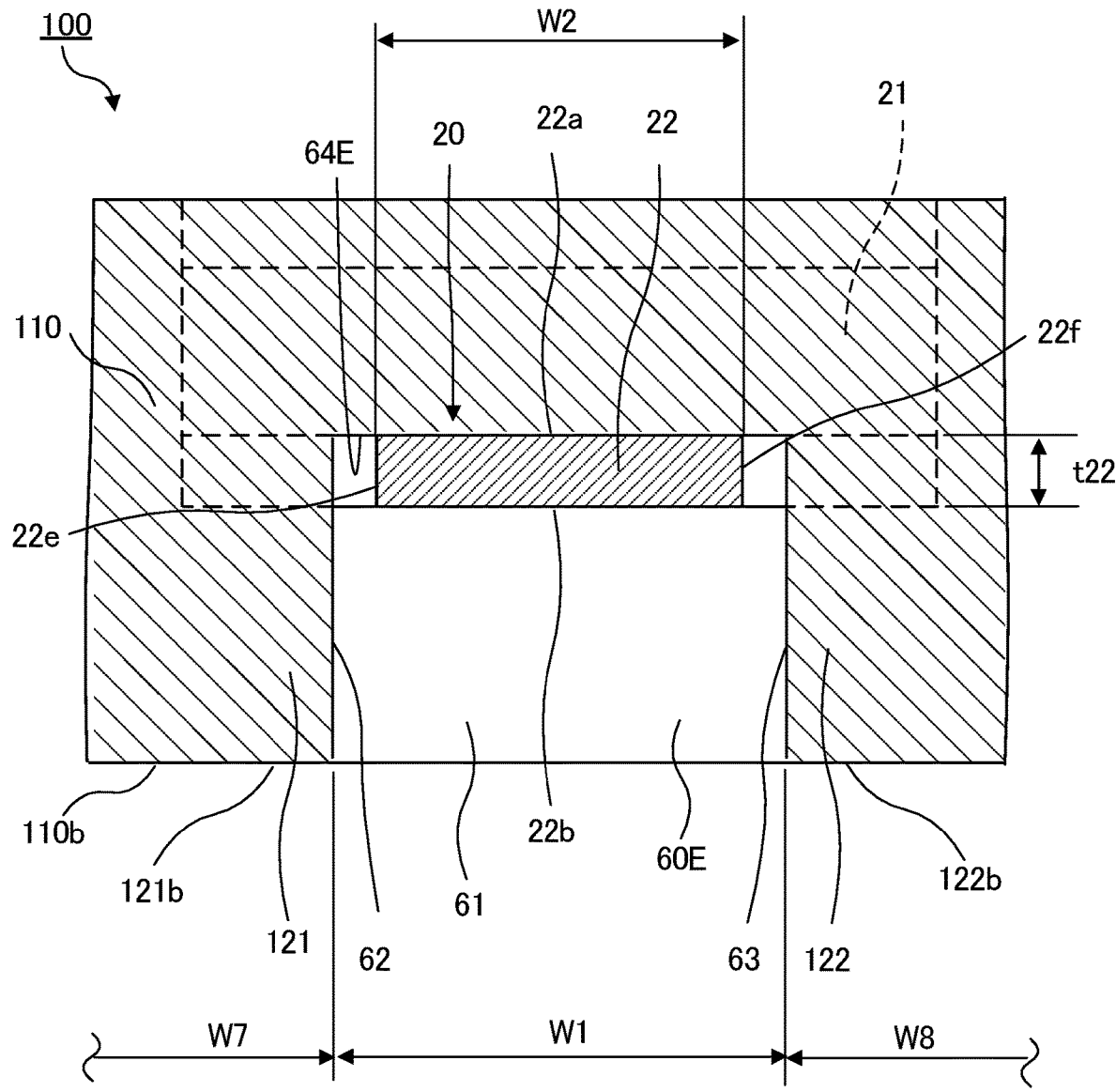
FIG. 24 is a cross-sectional view illustrating a part of the enclosure including a recessed part according to a modification.

The wall surface 64 is formed in the same position as the second surface 22b of the second piece 22 of the external connection terminal 20 in the Z1 direction. The wall surface 64 intersects with the Z-axis. The wall surface 64 may be formed in a position different from the second surface 22b of the second piece 22 in the Z1 direction. The wall surface 64 may be disposed apart from the second surface 22b of the second piece 22 along the Z1 direction. For example, as illustrated in FIG. 24, a wall surface 64E on the upper side may be formed in the same position as the first surface 22a of the second piece 22. The wall surfaces 64 and 64E may be disposed between the first surface 22a and the second surface 22b of the second piece 22 in the Z1 direction.

The width W1 of the recessed part 60 is larger than the width W2 of the second piece 22. The width W1 of the recessed part 60 is defined by the distance between the wall surfaces 62 and 63. The width W2 of the second piece 22 is defined by the distance between the side surfaces 22e and 22f. The extending parts 121 and 122 are spaced apart from each other in the X2 direction. Each of the extending parts 121 and 122 extend along the Z2 direction from a position corresponding to the second surface 22b of the external connection terminal 20.

Lower surfaces 121b and 122b of the extending parts 121 and 122 are formed in the same positions as the bottom surface 110b of the enclosure 110 in the Z2 direction. These lower surfaces 121b and 122b may be disposed in positions different from the bottom surface 110b of the enclosure 110 in the Z2 direction. The lower surfaces 121b and 122b are positioned apart from the second surface 22b of the external connection terminal 20 in the Z2 direction. It is preferred that the distance between each of the lower surfaces 121b and 122b, and the second surface 22b of the external connection terminal 20 be at least twice the thickness t22 of the second piece 22. The lower surfaces 121b and 122b may be disposed apart from the upper surface of the laminated substrate 400 illustrated in FIG. 5 in the Z1 direction.

The width W7 of the extending parts 121 along the X2 direction is 30% or more of the width W2 of the second piece 22 of the external connection terminal 20. The same is applied to the width W8 of the extending parts 122.

As illustrated in FIGS. 4 and 6, in the Y direction, the length L2 of the second surface 22b of the second piece 22 exposed from the enclosure 110 is longer than the length L1 of the first surface 22a of the second piece 22 exposed from the enclosure 110. Here, the length L2 can be also called "the length L2 of a part that corresponds to the second piece 22 and that is a part of the second surface 22b of the external connection terminal 20." Furthermore, the length L1 can be also called "the length L1 of a part that corresponds to the second piece 22 and that is a part of the first surface 22a of the external connection terminal 20." The second surface 22b of the second piece 22 includes the first part 22c formed in the protruding part 27, and the second part 22d formed in the base part 26 and exposed by the recessed part 60 described below. In the Y2 direction, the length L3 of the first part 22c of the second surface 22b is longer than the length L4 of the second part 22d of the second surface 22b. In other words, in the second surface 22b, the length L3 of the first part 22c corresponding to the protruding part 27 is longer than the length L4 of the second part 22b corresponding to the base part 26.

Figure 7:
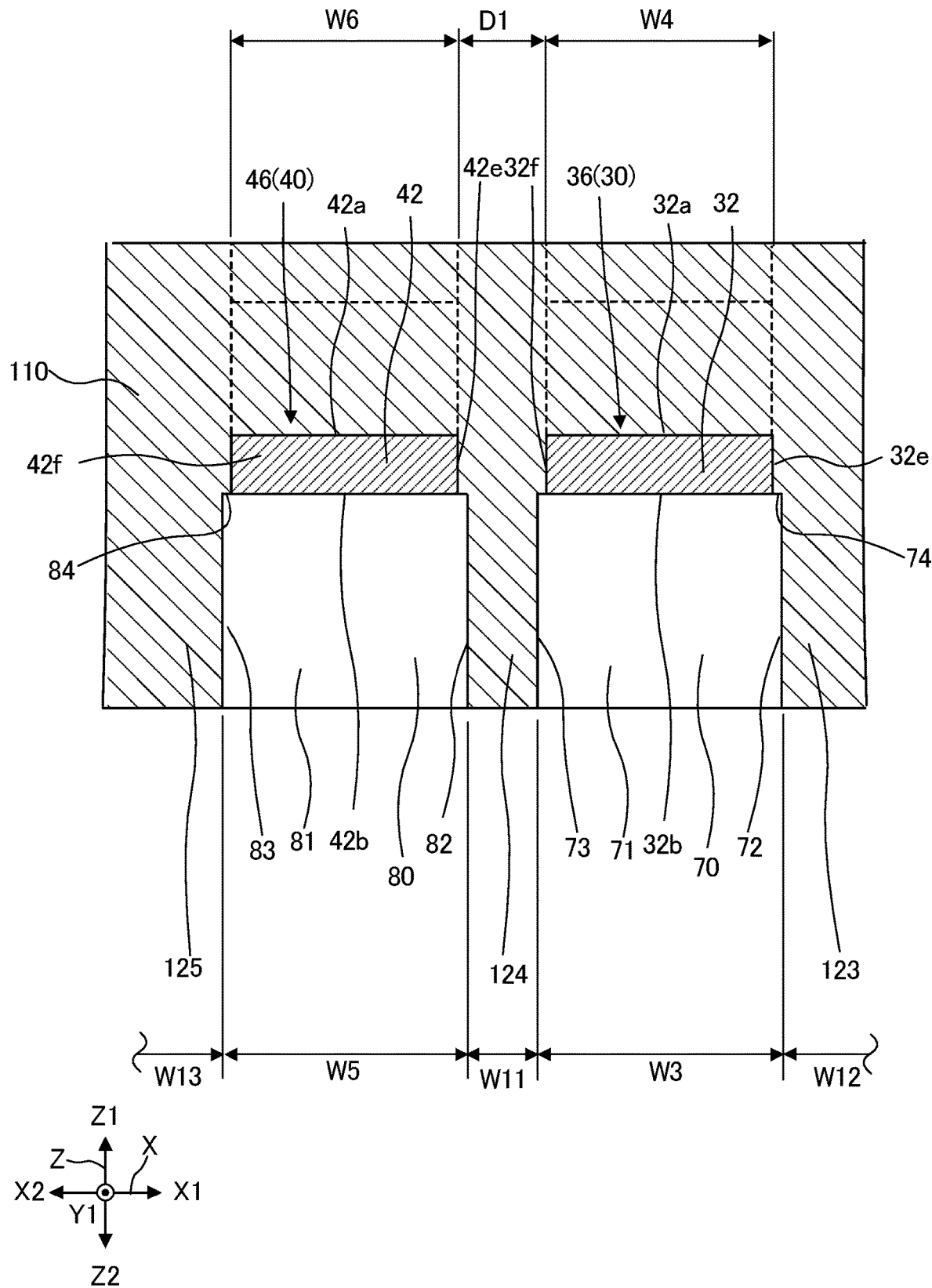
FIG. 7 is a cross-sectional view illustrating the external connection terminals embedded in the enclosure and shows a cross-section taken along line VII-VII shown in FIG. 2.
Figure 8:
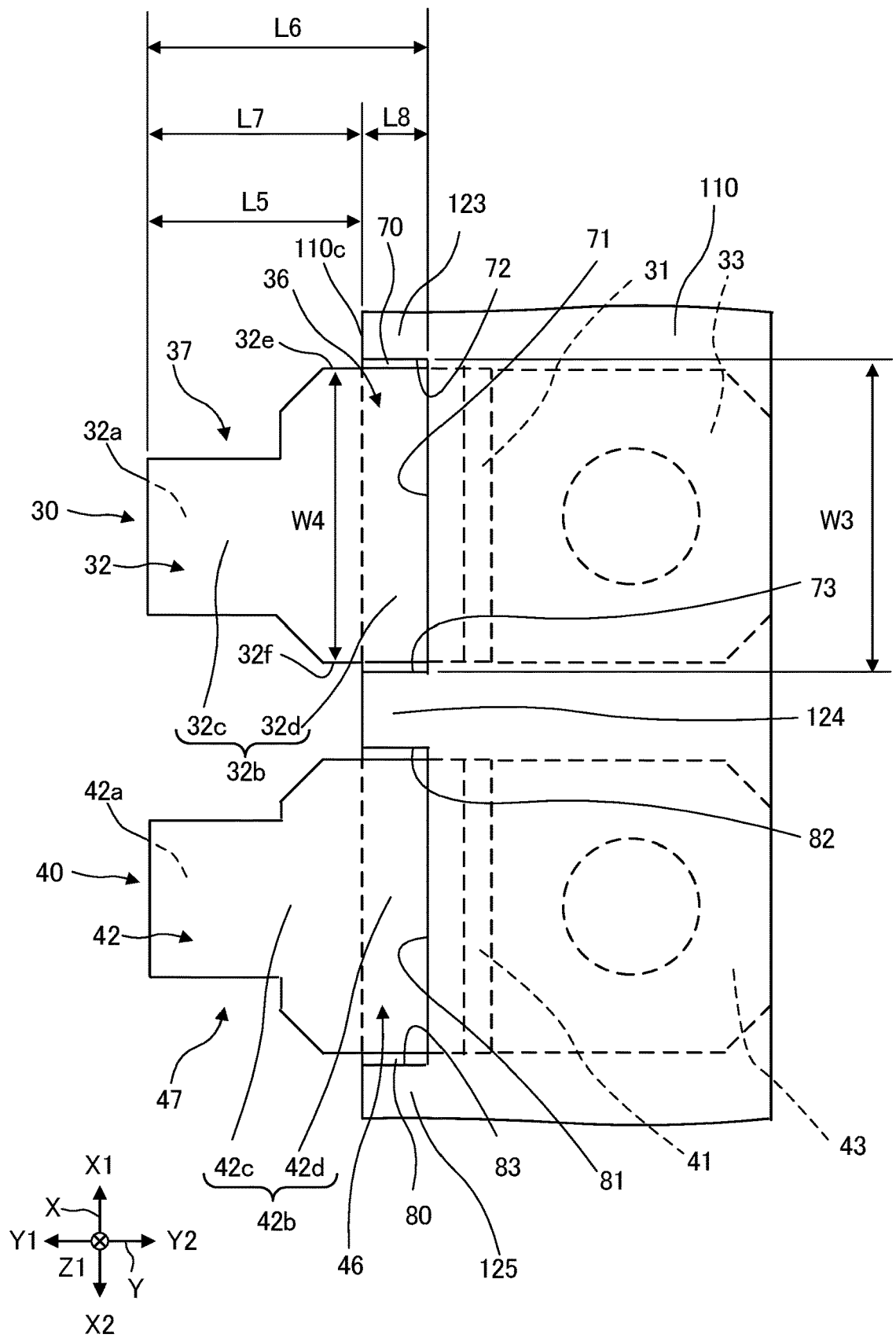
FIG. 8 is a bottom view illustrating a part of the enclosure and shows a recessed part that exposes a second surface of the second piece of the external connection terminal.

Next, description will be given of external connection terminals 30 and 40, recessed parts 70 and 80, and extending parts 123 to 125. FIG. 7 is a cross-sectional view illustrating the external connection terminals 30, 40 embedded in the enclosure 110. FIG. 7 illustrates cross-section taken along line VII-VII shown in FIG. 2. FIG. 8 is a bottom view illustrating a part of the enclosure 110. FIG. 8 shows the recessed parts 70 and 80 that expose the second surfaces 32b and 42b of second pieces 32 and 42 of the external connection terminals 30 and 40.

As illustrated in FIGS. 2, 7, and 8, the external connection terminal 40 is spaced apart from and the external connection terminal 30 along the X1 direction. The external connection terminals 30 and 40 each have the same configuration of the external connection terminal 20. That is, the external connection terminal 30 includes at least a first surface 32a, a second surface 32b and a base part 36. The external connection terminal 40 includes at least a first surface 42a, a second surface 42b, and a base part 46. As illustrated in FIG. 8, the external connection terminal 30 includes a first piece 31, a second piece 32, and a third piece 33. The second piece 32 has a base part 36 embedded in the enclosure 110, and a protruding part 37 that protrudes from an inner wall 110c of the enclosure 110 in the Y1 direction. The inner wall 110c is a surface that around a space inside the enclosure 110, that is, a space for housing the semiconductor unit 3, and it intersects with the Y-axis.

The external connection terminal 40 includes a first piece 41, a second piece 42, and a third piece 43. The second piece 42 includes a base part 46 embedded in the enclosure 110, and a protruding part 47 that protrudes from the inner wall 110c of the enclosure 110 in the Y-axis direction. The external connection terminal 30 is one example of a second external connection terminal, and the external connection terminal 40 is one example of a third external connection terminal.

As illustrated in FIGS. 7 and 8, the recessed parts 70 and 80 are formed in the enclosure 110. The recessed part 70 is one example of a second recessed part. The recessed part 80 is one example of a third recessed part. The recessed part 70 exposes the second surface 32b of the base part 36 included in the external connection terminal 30. Specifically, the recessed part 70 exposes a second part 32d of the second surface 32b formed in the base part 36. The second surface 32b includes a first part 32c and the second part 32d. The recessed part 70 is formed such that the first part 32c and the second part 32d are continuous with each other in the Y2 direction. The recessed part 70 is defined by wall surfaces 71 to 74 of the enclosure 110. The wall surface 71 intersects with the Y-axis, and is positioned apart from the inner wall 110c in the Y2 direction. As illustrated in FIG. 8, the wall surface 71 is positioned between a first surface 31c of the first piece 31 and the inner wall 110c, and it is in particular, in an intermediate position of the base part 36 in the Y2 direction. The wall surface 71 is one example of a wall surface of the enclosure 110 that defines the recessed part 70 in the Y2 direction.

The wall surfaces 72 and 73 oppose each other in the X2 direction. The second piece 32 includes a side surface 32e, and a side surface 32f that is spaced apart from the side surface 32e along the X direction. The wall surface 72 is positioned apart from the side surface 32e of the second piece 32 in the X1 direction. The wall surface 73 is positioned apart from the side surface 32f of the second piece 32 in the X2 direction. The side surfaces 32e and 32f are covered with resin of the enclosure 110, but they may be not in contact with resin of the enclosure 110. There may be a gap between the side surfaces 32e and 32f, and the resin of the enclosure 110.

The wall surface 74 is formed in the same position as the second surface 32b of the second piece 32 included in the external connection terminal 30 in the Z2 direction. The wall surface 74 intersects with the Z-axis, and it may be formed in a position different from the second surface 32b of the second piece 32 in the Z2 direction. The wall surface 74 may be disposed apart from the second surface 32b of the second piece 32 in the Z1 direction. For example, the wall surface 74 may be formed in the same position as a first surface 32a of the second piece 32, or it may be disposed between the first surface 32a and the second surface 32b of the second piece 32 in the Z2 direction.

The recessed part 80 exposes the second surface 42b of the base part 46 included in the external connection terminal 40. Specifically, the recessed part 80 exposes a second part 42d of the second surface 42b formed in the base part 46. The second surface 42b includes a first part 42c and the second part 42d. The recessed part 80 is formed such that the first part 42c and the second part 42d are continuous with each other in the Y2 direction. The recessed part 80 is defined by wall surfaces 81 to 84 of the enclosure 110. The wall surface 81 intersects with the Y-axis, and is positioned apart from the inner wall 110c in the Y2 direction. The wall surface 81 is positioned between a first surface 41c of the first piece 41 and the inner wall 110c, and in particular, it is in an intermediate position of the base part 46 in Y2 direction. The wall surface 81 is one example of a wall surface of the enclosure 110 that defines the recessed part 80 in the Y2 direction.

The wall surfaces 82 and 83 oppose each other in the X2 direction. The second piece 42 includes a side surface 42e, and a side surface 42f that is spaced apart from the side surface 42e along the X2 direction. The wall surface 82 is positioned apart from the side surface 42e of the second piece 42 in the X1 direction. The wall surface 83 is positioned apart from the side surface 42f of the second piece 42 in the X2 direction. The side surfaces 42e and 42f are covered with resin of the enclosure 110, but they may not be in contact with the resin of the enclosure 110. There may be a gap between the side surfaces 42e and 42f, and the resin of the enclosure 110.

The wall surface 84 is formed in the same position as the second surface 42b of the second piece 42 of the external connection terminal 40 in the Z2 direction. The wall surface 84 intersects with the Z-axis, and it may be formed in a position different from the second surface 42b of the second piece 42 in the Z2 direction. The wall surface 84 may be disposed apart from the second surface 42b of the second piece 42 in the Z1 direction. For example, the wall surface 84 may be formed in the same position as a first surface 42a of the second piece 42, or it may be disposed between the first surface 42a and the second surface 42b of the second piece 42 in the Z2 direction.

The width W3 of the recessed part 70 is larger than the width W4 of the second piece 32. The width W3 of the recessed part 70 is the distance between the wall surfaces 72 and 73. The width W4 of the second piece 32 is the distance between the side surfaces 32e and 32f.

The width W5 of the recessed part 80 is greater than the width W6 of the second piece 42. The width W5 of the recessed part 80 is the distance between the wall surfaces 82 and 83. The width W6 of the second piece 42 is the distance between the side surfaces 42e and 42f. The extending part 124 is positioned between the recessed parts 70 and 80 in the X2 direction, and extends along the Z2 direction from a position corresponding to the second surface 32a (42b) of the external connection terminal 30 (40). The extending part 123 is positioned apart from the extending part 124 in the X1 direction, and extends along the Z2 direction from the position corresponding to the second surface 32b of the external connection terminal 30. The extending part 125 is positioned apart from the extending part 124 in the X direction, and extends along the Z2 direction from the position corresponding to the surface 42b of the external connection terminal 40.

The width W11 of the extending part 124 along the X2 direction may be less than an interval D1 between the side surface 32f of the second piece 32 and the side surface 42e of the second piece 42. The width W11 of the extending part 124 may be preferably 80% or more and 99% or less of the interval D1. The width W12 of the extending parts 123 along the X2 direction is greater than the width W11 of the extending part 124, but it may be the same as the width W11. Similarly, the widths W13 of the extending parts 125 along the X2 direction is greater than the width W11 of the extending part 124, but it may be the same as the width W11. The extending part 124 is one example of a third extending part, the extending part 123 is one example of a fifth extending part, and the extending part 125 is one example of a fourth extending part.

As illustrated in FIG. 8, in the Y2 direction, the length L6 of the second surface 32b of the second piece 32 exposed from the enclosure 110 is longer than the length L5 of the first surface 32a of the second piece 32 exposed from the enclosure 110. The second surface 32b of the second piece 32 includes the first part 32c formed in the protruding part 37, and the second part 32d formed in the base part 36 and exposed by the recessed part 70. In the Y2 direction, the length L7 of the first part 32c of the second surface 32b is longer than the length L8 of the second part 32d of the second surface 32b.

In the Y2 direction, the length L6 of the second surface 42b of the second piece 42 exposed from the enclosure 110 is longer than the length L5 of the first surface 42a of the second piece 42 exposed from the enclosure 110. The second surface 42b of the second piece 42 includes the first part 42c formed in the protruding part 47, and the second part 42d formed in the base part 46 and exposed by the recessed part 80. In the Y-axis direction, the length L7 of the first part 42c of the second surface 42b is longer than the length L8 of the second part 42d of the second surface 42b.

As illustrated in FIG. 7, the enclosure 110 includes the extending parts 123 to 125. The extending part 123 is positioned in the X1 direction of the recessed part 70. The extending part 124 is positioned in the X2 direction of the recessed part 70. The extending part 124 is positioned in the X1 direction of the recessed part 80. In other words, the extending part 124 is positioned between the recessed part 70 and the recessed part 80. The extending part 125 is positioned in the X2 direction of the recessed part 80. Each of the extending parts 123 to 125 extends along the Z2 direction from the position corresponding to the second surface 32b (42b) of the external connection terminal 30 (40).

In such a semiconductor package 100, the recessed parts 60, 70 and 80 are formed in the enclosure 110, and the second surfaces 22b, 32b and 42b of the external connection terminals 20, 30 and 40 are exposed. The recessed parts 60, 70 and 80 are provided, and no part of each of the second surfaces 22b, 32b and 42b is in contact with the enclosure 110. For this reason, even when the external connection terminals 20, 30 and 40 are deformed toward the second surfaces 22b, 32b and 42b from the first surfaces 22a, 32a and 42a. That is, the rigidity of the external connection terminals 20, 30 and 40 is reduced.

Specifically, when the external connection terminals 20, 30 and 40 are joined to the internal connection terminals 441, 442 and 443 at the time of manufacturing of the semiconductor package 100, it is easy to bend the second pieces 22, 32 and 42 of the external connection terminals 20, 30 and 40. As a result, the external connection terminals 20, 30 and 40 are easily in contact with the internal connection terminals 441, 442 and 443. Furthermore, the rigidity of each of the external connection terminals 20, 30 and 40 is reduced, which results in weakening a reaction force that acts by pressing the external connection terminals 20, 30 and 40 against the internal connection terminals 441, 442 and 443. Accordingly, the concentration of stress that acts on the enclosure 110 is alleviated. The stress generated due to the action of the reaction force from the external connection terminals 20, 30 and 40 in the enclosure 110 is alleviated. By reducing the rigidity of each of the external connection terminals 20, 30 and 40, a residual stress in the external connection terminals 20, 30 and 40 is reduced after the manufacturing of the semiconductor package 100.

For example, the dimensional tolerance, the assembly tolerance of each of the parts (e.g., the enclosure 110, the external connection terminals 20, 30 and 40, and the semiconductor units 3) are large, and contact between the external connection terminal 20 and the internal connection terminal 441 may be incomplete. In some cases, such a state may cause separation due to lack of bonding strength, decrease of electrical properties, or decrease of thermal properties when the external connection terminal 20 and the internal connection terminal 441 are joined together. However, in the semiconductor package 100, the rigidity of the second piece is reduced. Furthermore, the second piece 22 and the internal connection terminal 441 can be joined to each other in close contact with each other by pressing the second piece 22 against the internal connection terminal 441. Accordingly, the joining strength of the external connection terminal 20 and the internal connection terminal 441 is improved. The joining of the external connection terminal 20 and the internal connection terminal 441 will be described below.

Each of the external connection terminals 20, 30 and 40 includes a crank structure formed in a part embedded in the enclosure 110. The crank structures embedded in the enclosure 110 include the first pieces 21, 31 and 41, the base parts 26, 36 and 46 of the second pieces 22, 32 and 42, and the third pieces 23, 33 and 43. Such a semiconductor package 100 including the crank structures embedded in the enclosure 110 enables stress that acts on the external connection terminals 20, 30, and 40 to be relieved. For example, when a busbar is joined to the third pieces 23, 33 and 43, a stress along the Z-axis acts in the external connection terminals 20, 30 and 40. Each of the external connection terminals 20, 30 and 40 includes the crank structure formed in the part embedded in the enclosure 110. As a result, when the busbar is joined, the stress that acts along a direction of the Z-axis is relieved. As above, by relieving the stress that acts on the external connection terminals 20, 30 and 40, a reaction force (load) that acts on the enclosure 110 from the external connection terminals 20, 30, 40 is reduced.

The external connection terminal 20 of the semiconductor package 100 includes the first piece 21, the second piece 22, and the third piece 23, which is a simple structure. Accordingly, the stress that acts on the external connection terminal 20 can be relieved even when an external connection terminal having a complicated structure is not employed. For this reason, the increase in inductance of the external connection terminal 20 is avoided. In the semiconductor package 100, a configuration of each of the external connection terminals 20 is simple, which enables increase in size of the external connection terminals 20 and the enclosure 110 to be avoided.

In the semiconductor package 100, the rigidity of each of the external connection terminals 20, 30 and 40 is reduced, which enables the reaction force that acts on parts, such as the laminated substrate 400 and the internal connection terminal 441 mounted thereon, to be relieved. In the semiconductor package 100, the recessed part 60 is formed in the enclosure 110, which enables the stress generated in the enclosure 110 to be relieved. As a result, the increase in inductance of each of the external connection terminals 20, 30 and 40 is suppressed, as is the increase in size of the enclosure 110, and increase in manufacturing costs of the semiconductor package 100 are suppressed. Material costs and processing costs are included in the manufacturing cost.

As illustrated in FIG. 3, the enclosure 110 includes a receiving part 131, which is one example of a first receiving part 131. The receiving part 131 is positioned in the Z1 direction of the base part 26 of the external connection terminal 20 and in the Y2 direction of the first piece 21 thereof. The receiving part 131 is in contact with the first surface 22a of the base part 26 and the second surface 21d of the first piece 21. The receiving part 131 is in contact with the external terminal 9 (an example of a first external terminal) in the Z1 direction. The external terminal 9 is spaced apart from the first surface 22a of the base part 26 in the Z1 direction (an opposite direction of the Z2 direction). Such an enclosure 110 includes the receiving part 131, which enables the area in which the external terminal 9 is in contact with the external connection terminal 20 to be increased, and enables the stress generated in the enclosure 110 to be reduced.

As illustrated in FIG. 2, the enclosure 110 includes receiving parts 132 and 133. The receiving part 132 is connectable to an external terminal (an example of a second external terminal) to be connected to the external connection terminal 30. The receiving part 132 is one example of a second receiving part. The receiving part 133 is connectable to an external terminal (an example of a third external terminal) to be connected to the external connection terminal 40. The receiving part 133 is one example of a third receiving part. The receiving parts 132 and 133 have configurations similar to that of the receiving part 131. Such an enclosure 110 includes the receiving parts 132 and 133, which enables the area in which each of the external connection terminals 30 and 40 is in contact with the corresponding external terminal to be increased, and enables the stress generated in the enclosure 110 to be reduced.

As illustrated in FIGS. 5 and 6, the enclosure 110 includes the extending parts 121 and 122. The extending parts 121 and 123 that define the recessed part 60 are formed in the enclosure 110, and therefore, the rigidity of the enclosure 110 is ensured. The recessed part 60 is formed in the enclosure 110, and there is a part in which the volume of the enclosure 110 is less. However, the extending parts 121, 122 are formed, and therefore a necessary rigidity is ensured. Unnecessary deformation of the enclosure 110 is suppressed, and the external connection terminal 20 is stably held. The suppression of the deformation of the enclosure 110 results in maintaining electrical connection between the external connection terminal 20 and the external terminal 9 as well as the electrical connection between the external connection terminal 20 and the semiconductor unit 3.

As illustrated in FIGS. 7 and 8, the enclosure 110 includes the extending parts 123 to 125. The extending parts 123 to 125 are formed to be adjacent to the recessed parts 70 and 80 of the enclosure 110, and therefore, the rigidity of the enclosure 110 is ensured. The recessed parts 70 and 80 are formed in the enclosure 110, and this causes a space in the enclosure 110 to be reduced due to the volume of the recessed parts. However, the extending parts 123 to 125 ensure a necessary rigidity. Unnecessary deformation of the enclosure 110 is suppressed, and the external connection terminal 30 is stably maintained. Suppression of the deformation of the enclosure 110 enables electrical connections between each of the external connection terminals 30 and 40, and the corresponding external terminals, to be maintained. Similarly, the electrical connections between each of the external connection terminals 30 and 40, and the semiconductor unit 3, are maintained. Furthermore, the extending part 124 positioned between the recessed parts 70 and 80 ensures a creepage distance. As a result, the insulation performance between the external connection terminal 30 and the external connection terminal 40 is improved.

In the semiconductor package 100, the rigidity of the enclosure 110 is ensured, and therefore, the electrical connections between each of the external connection terminals 20, 30 and 40, and the corresponding external terminal are suitably maintained. For example, a deformed enclosure 110 causes the screws for joining the external terminals to loosen, which results in decreasing performance of the semiconductor package 100. However, the semiconductor package 100 ensures the rigidity of the enclosure 110, which enables the joining of the external terminal with the semiconductor package 100 to be maintained and enables decrease in performance of the semiconductor package 100 to be suppressed.

As illustrated in FIG. 3, the semiconductor package 100 includes a sealing part 8 that is used to seal the semiconductor units 3. In FIGS. 1 and 2, and in other drawings, sealing part 8 is not shown. The sealing part 8 is formed by filling resin materials (e.g., epoxy resin or silicone gel) in the space on the inner side of the enclosure 110. The sealing part 8 may include various fillers such as silicon oxide or aluminum oxide. The second pieces 22, 32 and 42 of the external connection terminals 20, 30 and 40 exposed from the enclosure 110 are sealed by the sealing part 8. Furthermore, resin materials are filled in the space in the recessed parts 60, 70 and 80, and as a result, the second surfaces 22b, 32b and 42b of the base parts 26, 36 and 46 of the external connection terminals 20, 30 and 40 are sealed.

As described above, the sealing part 8 enables adhesion of a foreign object to the semiconductor units 3 and the external connection terminals 20, 30 and 40 to be suppressed, and reliability is improved in the semiconductor package 100. Furthermore, the insulation property between the external connection terminals 30 and 40 adjacent to each other in the X2 direction is ensured.

The semiconductor package 100 may include a cooling device 2. The cooling device 2 is disposed in the Z2 direction of the semiconductor units 3 and the enclosure 110. The cooling device 2 includes fins and a water-cooling jacket to cool the semiconductor units 3. The cooling device 2 is disposed so as to cover lower surfaces of the enclosure 110 and the semiconductor units 3. A lower surface of the metal layer 402 of the laminated substrate 400 is in contact with an upper surface of the cooling device 2. The cooling device 2 may be joined to the lower surface of the enclosure 110 with adhesive agent. The cooling device 2 may be joined to the metal layer 402 with sheet-like adhesive agent. The joining of the cooling device 2 is not limited thereto, and the cooling device 2 may be joined to the enclosure 110 or the semiconductor units 3 by other methods. Instead of the cooling device 2, the semiconductor package 100 may include a heatsink and may include other supporting members.

Second Embodiment

Figure 9:
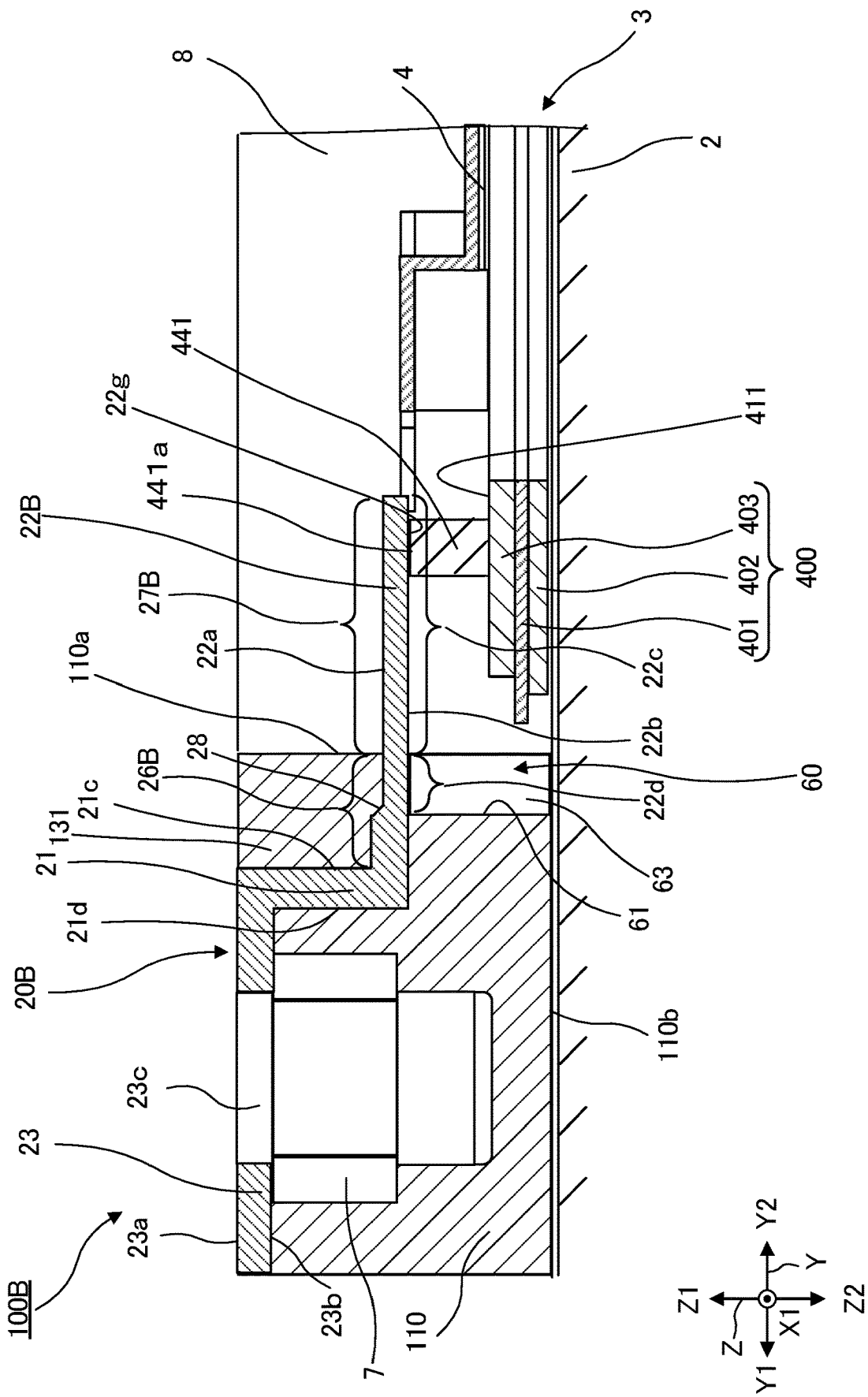
FIG. 9 is a cross-sectional view illustrating a part of a semiconductor package according to a second embodiment.
Figure 10:
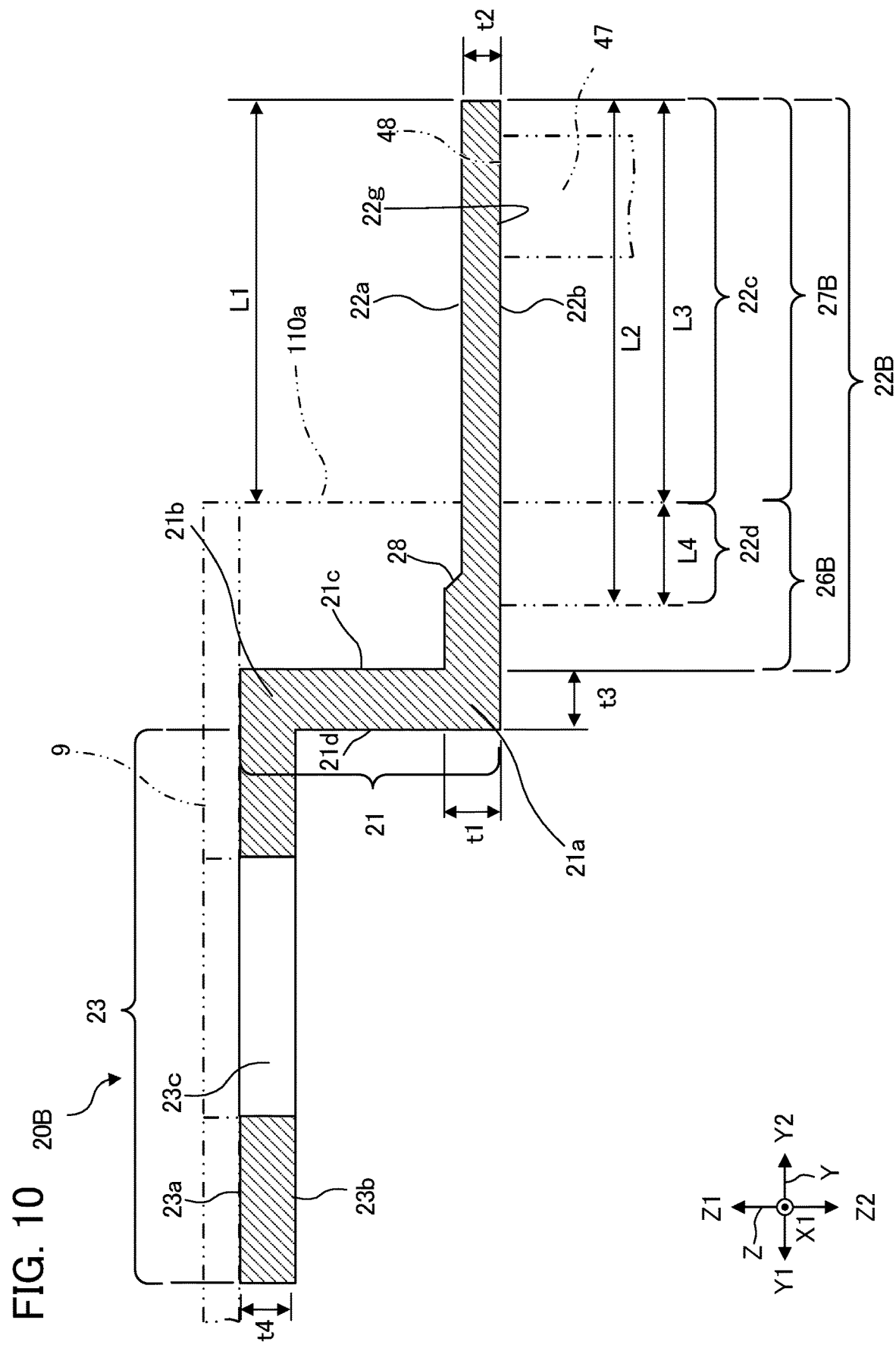
FIG. 10 is a cross-sectional view illustrating an external connection terminal shown in FIG. 9.
Figure 11:
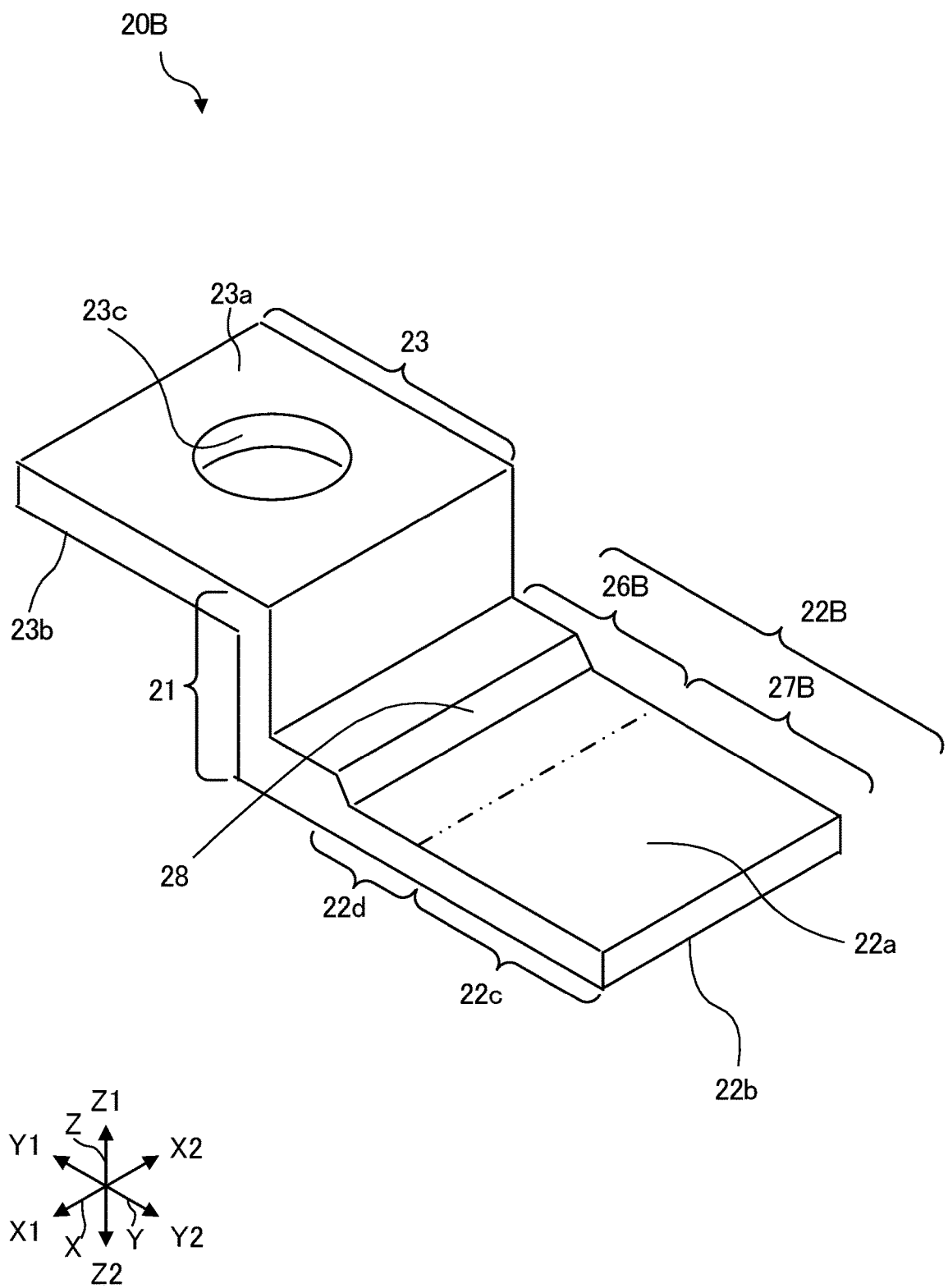
FIG. 11 is a perspective view illustrating the external connection terminal shown in FIG. 9.

Next, with reference to FIGS. 9 to 11, a semiconductor package 100B according to a second embodiment will be described. FIG. 9 is a cross-sectional view illustrating a part of the semiconductor package 100B according to the second embodiment. FIG. 10 is a cross-sectional view illustrating an external connection terminal 20B in FIG. 9. FIG. 11 is a perspective view illustrating the external connection terminal 20B shown in FIG. 9.

The semiconductor package 100B differs from the semiconductor package 100 according to the first embodiment in that the semiconductor package 100B includes the external connection terminals 20B each having a step part 28 instead of the external connection terminals 20. In the description of the semiconductor package 100B, description similar to that for the semiconductor package 100 is omitted.

The external connection terminal 20B includes a first piece 21, a second piece 22B, and a third piece 23. The second piece 22B includes a base part 26B and a protruding part 27B. The base part 26B is embedded in the enclosure 110. The protruding part 27B protrudes in the Y2 direction in which the protruding part 27B protrudes from the inner wall 110a of the enclosure 110. As illustrated in FIG. 10, the base part 26B has two level thicknesses, specifically, a thickness t1 and a thickness t2 that is thinner than the thickness t1. The thickness t1 is one example of a first thickness, and the thickness t2 is one example of a second thickness. The protruding part 27 has the thickness t2. The base part 26B includes the step part 28. The thickness t1 and the thickness t2 are along the Z2 direction. The thickness t2 may be 50% or more and 90% or less of the thickness t1, for example. The thickness t1 may be the same as a thickness t3 of the first piece 21, or it may be thinner than the thickness t3. The step part 28 is one in which the thickness of the base part 26B is changed from the thickness t1 to the thickness t2. The thickness t2 is equal to or greater than a thickness necessary in the joining method for joining the protruding part 27B, for example. Specifically, the thickness t2 is equal to or greater than a thickness necessary at the time of laser welding, for example. The reaction force that acts on the enclosure 110 can be reduced more when the thickness t2 is thinner.

As illustrated in FIG. 9, the step part 28 is positioned between the first surface 21c of the first piece 21 and the inner wall 110a in the Y2 direction. The wall surface 61 that defines the recessed part 60 is disposed in a position corresponding to the step part 28 in the Y2 direction. The position corresponding to the step part 28 may be a position that overlaps with the step part 28 when the step part 28 is seen in the Z-axis direction, for example. The wall surface 61 is closer to the protruding part 27B than the first surface 21c of the first piece 21.

Figure 12:
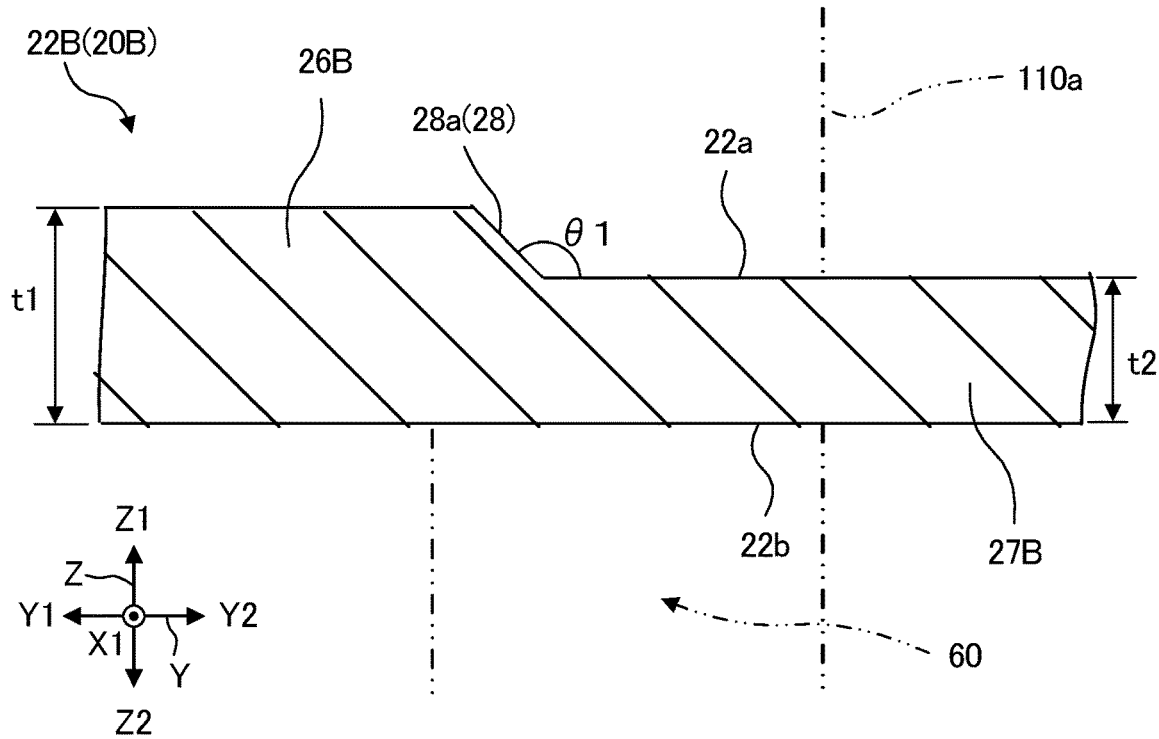
FIG. 12 is a cross-sectional view illustrating an enlarged step part of the external connection terminal.

As illustrated in FIG. 11 and FIG. 12, the step part 28 includes an inclined surface 28a. The inclined surface 28a is inclined to the XY plane. As illustrated in FIG. 12, an inclination angle θ1 of the inclined surface 28a to the first surface 22a is an obtuse angle, for example. The inclined surface 28a may be parallel to the XZ plane. The step part 28 is formed in the first surface 22a of the second piece 22.

As illustrated in FIG. 9, the step part 28 is embedded in the enclosure 110. The step part 28 is provided on the opposite side from the recessed part 60 in the Z1 direction. The step part 28 is provided on the opposite side from the connection surface 22g in the Z1 direction. The thickness t2 of the protruding part 27 is thinner than the thickness t3 of the first piece 21. The thickness t2 of the protruding part 27B may be 50% or more and 90% or less of the thickness t3 of the first piece 21, for example. The thickness t2 of the protruding part 27B may be thinner than a thickness t4 of the third piece 23. The thickness t2 of the protruding part 27B may be 50% or more and 90% or less of the thickness t4 of the third piece 23, for example.

The thickness t1 of the base part 26B may be the same as the thickness t3 of the first piece 21. The thickness t3 of the first piece 21 may be the same as the thickness t4 of the third piece 23. The thicknesses t1, t3 and t4 may be the same.

In the semiconductor package 100B according to the second embodiment, effects similar to those of the semiconductor package 100 according to the first embodiment are exhibited. In the semiconductor package 100B, the thickness t2 of the protruding part 27 of the external connection terminal 20B is thinner than the thickness t1 of the base part 26B embedded in the enclosure 110. For this reason, the rigidity of the protruding part 27 is reduced. In the external connection terminal 20B, the second piece 22 is easily bent, and the second piece 22 is easily joined to the internal connection terminal 441. Since the second piece 22 is thinner than the first piece 21, the rigidity of the second piece 22 is reduced, and the load applied to the enclosure 110 is reduced. In the semiconductor package 100B, the step part 28, which is a part in which the plate thickness changes, is embedded in the enclosure 110, and therefore, the thickness t2 of the protruding part 27B that protrudes from the enclosure 110 is thinner than the thickness t1.

In the external connection terminal 20B, as illustrated in FIG. 12, the step part 28 is formed on the opposite side from the recessed part 60 in the Z1 direction. In other words, the step part 28 extends to the opposite side from the recessed part 60. In the external connection terminal 20B, the protruding part 27 is easily bent in the Z2 direction. Tensile stress is generated between the first surface 22a and the inclined surface 28a instead of compressive stress. As a result, the protruding part 27 is easily connected to the internal connection terminal 441 by pressing on an end of the protruding part 27 in the Z2 direction. In the second embodiment, the external connection terminal 20B in which the step part 28 is provided has been described. However, the step part may be provided in the second pieces 32 and 42 of the external connection terminals 30 and 40.

For example, the following can be said when the external connection terminal 20B is conceived as "a cantilever beam that receives concentrated load" and the length of the protruding part 27B is conceived as the length of the beam. When the length of the beam is 1.5 T, the stress generated in a terminal supporting part becomes a value that is about 44% of the stress when the length of the beam is 1.0 T. The length of the beam is equivalent to L1 illustrated in FIG. 10. The terminal supporting part is a part of the enclosure 110 in contact with the second part 22d of the external connection terminal 20B when the part of the enclosure 110 exists in the part equivalent to the recessed part 60.

Figure 13:
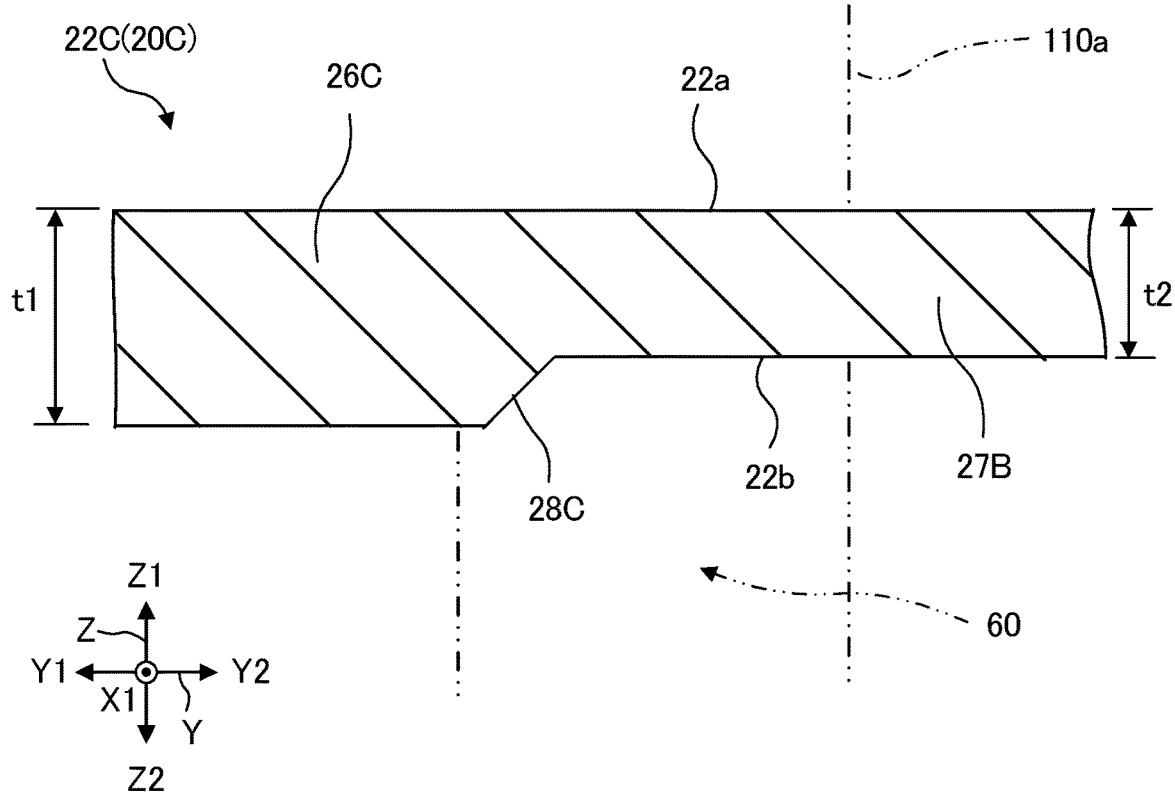
FIG. 13 is a cross-sectional view illustrating an enlarged step part of an external connection terminal according to a modification.

Next, with reference to FIG. 13, an external connection terminal 20C according to a modification will be described. FIG. 13 is a cross-sectional view illustrating an enlarged step part of the external connection terminal 20C according to the modification. In the external connection terminal 20C according to the modification, a step part 28C is disposed on a surface opposing the surface of the external connection terminal 20B being disposed in the Z2 direction. In this regard, the external connection terminal 20C differs from the external connection terminal 20B. The external connection terminal 20C includes a second piece 22C having the step part 28C. The second piece 22C includes a base part 26C including the step part 28C. As described above, the step part 28C may be at a position close to the recessed part 60.

Third Embodiment

Figure 14:
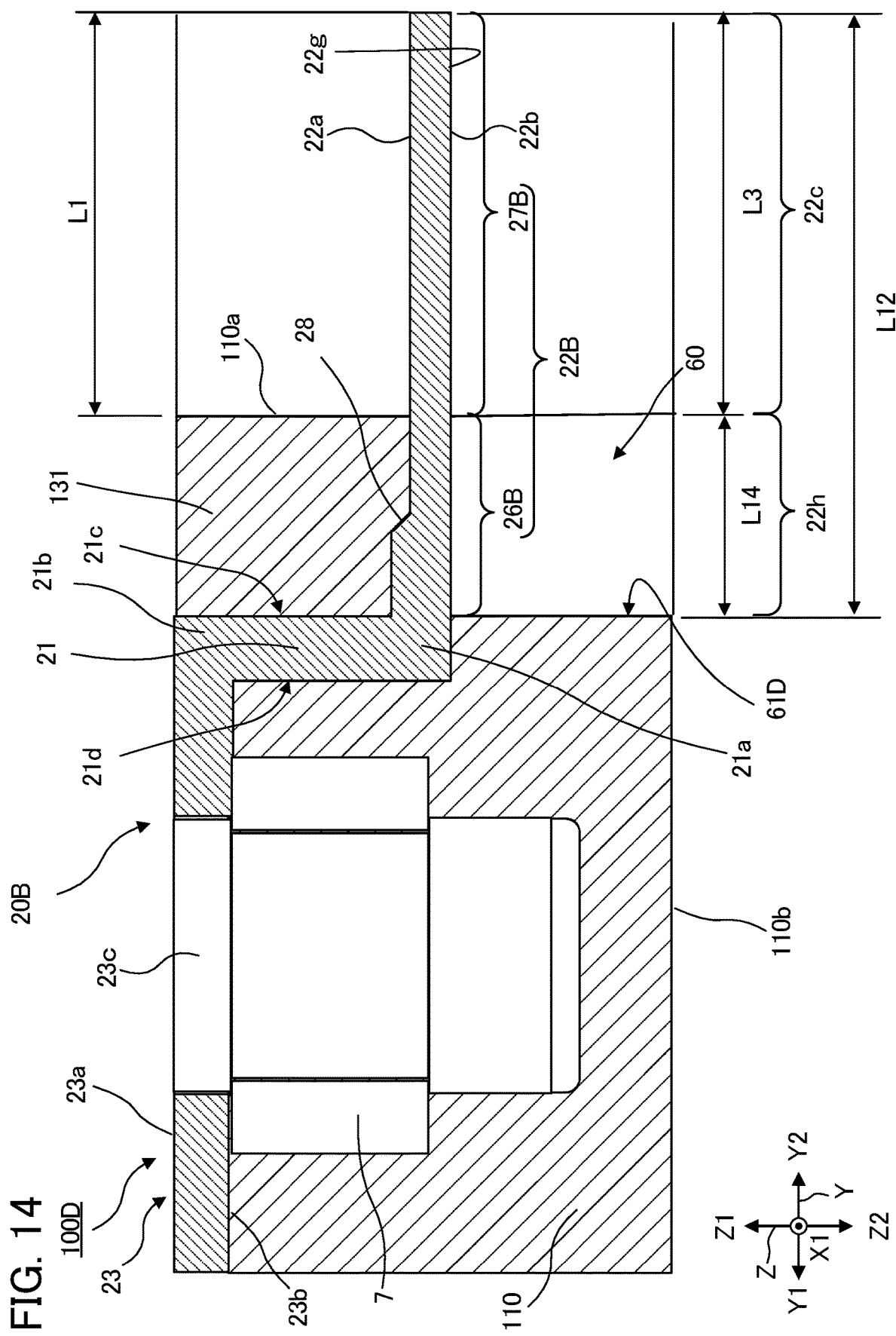
FIG. 14 is a cross-sectional view illustrating a part of a semiconductor package according to a third embodiment.

Next, with reference to FIG. 14, a semiconductor package 100D according to a third embodiment will be described. FIG. 14 is a cross-sectional view illustrating a part of the semiconductor package 100D according to the third embodiment. In FIG. 14, a part of the enclosure 110 and the external connection terminal 20B are illustrated. The semiconductor unit 3 and the sealing part 8 are not shown. In the semiconductor package 100D according to the third embodiment, the position of a wall surface 61D that defines the recessed part 60 is different in the Y2 direction. In this regard, the semiconductor package 100D differs from the foregoing embodiments. The enclosure 110 of the semiconductor package 100D includes the wall surface 61D instead of the wall surface 61. In the enclosure 110, the recessed part 60 is formed in the Y2 direction of the wall surface 61D. In the description of the semiconductor package 100D of the third embodiment, description similar to that for the semiconductor packages 100 and 100B of the abovementioned embodiments is omitted.

The wall surface 61D is disposed in a position corresponding to the first surface 21c of the first piece 21 in the Y2 direction. The position corresponding to the first surface 21c may be the same position as the first surface 21c in the Y2 direction. The wall surface 61D is closer to the protruding part 27B than the second surface 21d of the first piece 21 in the Y2 direction. The step part 28 is positioned between the wall surface 61D and the inner surface 100a in the Y2 direction. A part of the enclosure 110 also exists in the Z2 direction of a lower end 21a of the first piece 21.

In the Y2 direction, the length L12 of the second surface 22b of the second piece 22B exposed from the enclosure 110 is longer than the length L1 of the first surface 22a of the second piece 22 exposed from the enclosure 110. The second surface 22b of the second piece 22B includes the first part 22c formed in the protruding part 27B, and a second part 22h formed in the base part 26B and exposed by the recessed part 60. In the Y2 direction, a length L3 of the first part 22c of the second surface 22b is longer than a length L14 of the second part 22h of the second surface 22b.

Effects similar to those of the semiconductor packages 100 and 100B are exhibited in the semiconductor package 100D according to the third embodiment. In the semiconductor package 100D, the wall surface 61D is disposed in a position corresponding to the first surface 21c of the first piece 21, which enables the length L14 of the second part 22h to be longer than the above-mentioned length L4. As a result, it is easy to bend the second piece 22B in the Z2 direction. The longer length L14 enables the reaction force that acts on the enclosure 110 from the second piece 22B to be suppressed, and enables the concentration of stress generated in the enclosure 110 to be reduced.

The length L14 is preferred to be longer, but the reaction force from the first piece 21 in the Z2 direction cannot be received if the recessed part 60 is large enough to expose the lower end 21a of the first piece 21. However, in the semiconductor package 100D, the enclosure 110 has a part in contact with the lower end 21a of the first piece 21 in the Z2 direction. Accordingly, when an external terminal is connected to the external connection terminal 20B, the reaction force in the Z2 direction that acts on the first piece 21 can be received.

Fourth Embodiment

Figure 15:
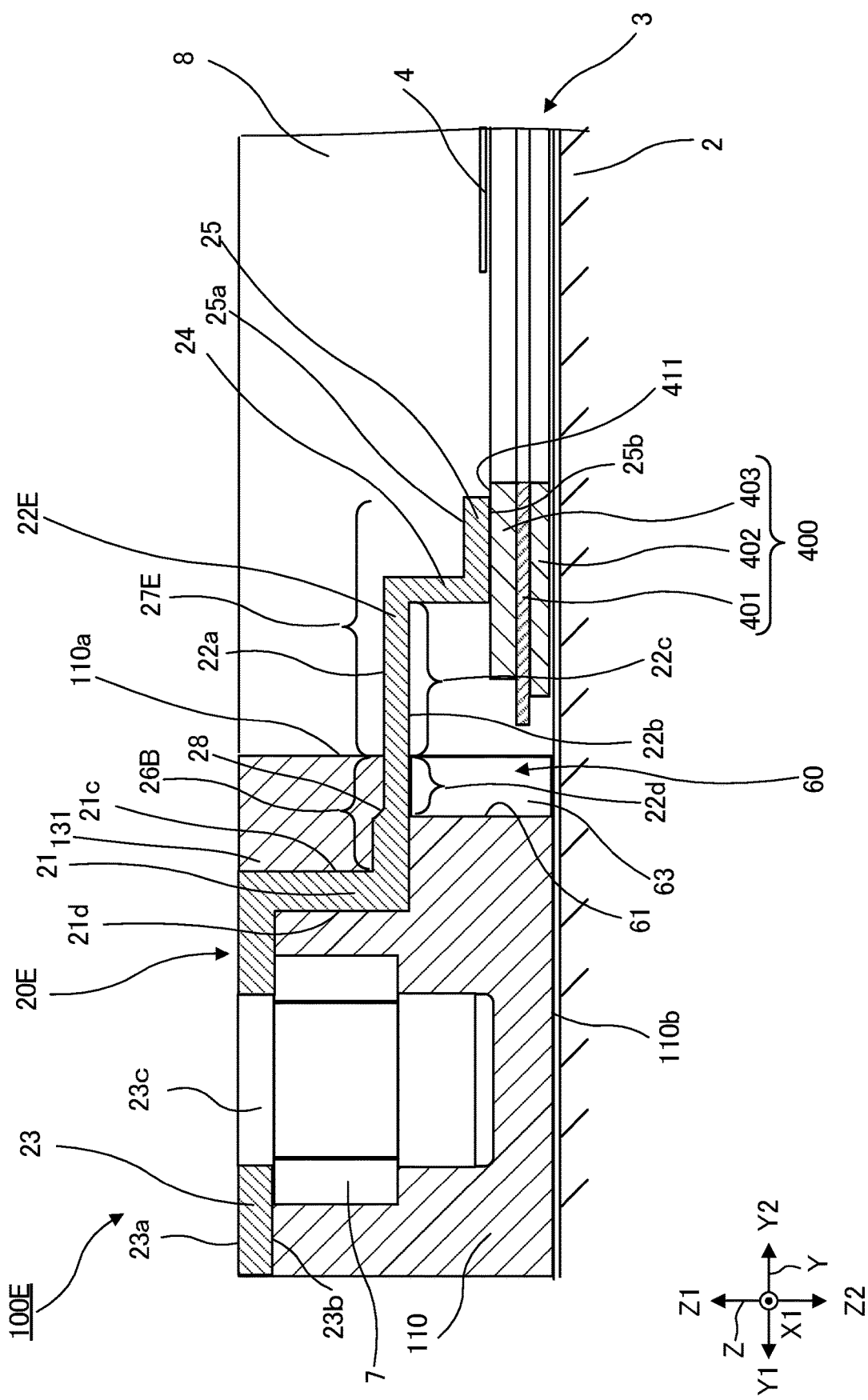
FIG. 15 is a cross-sectional view illustrating a part of a semiconductor package according to a fourth embodiment.
Figure 16:
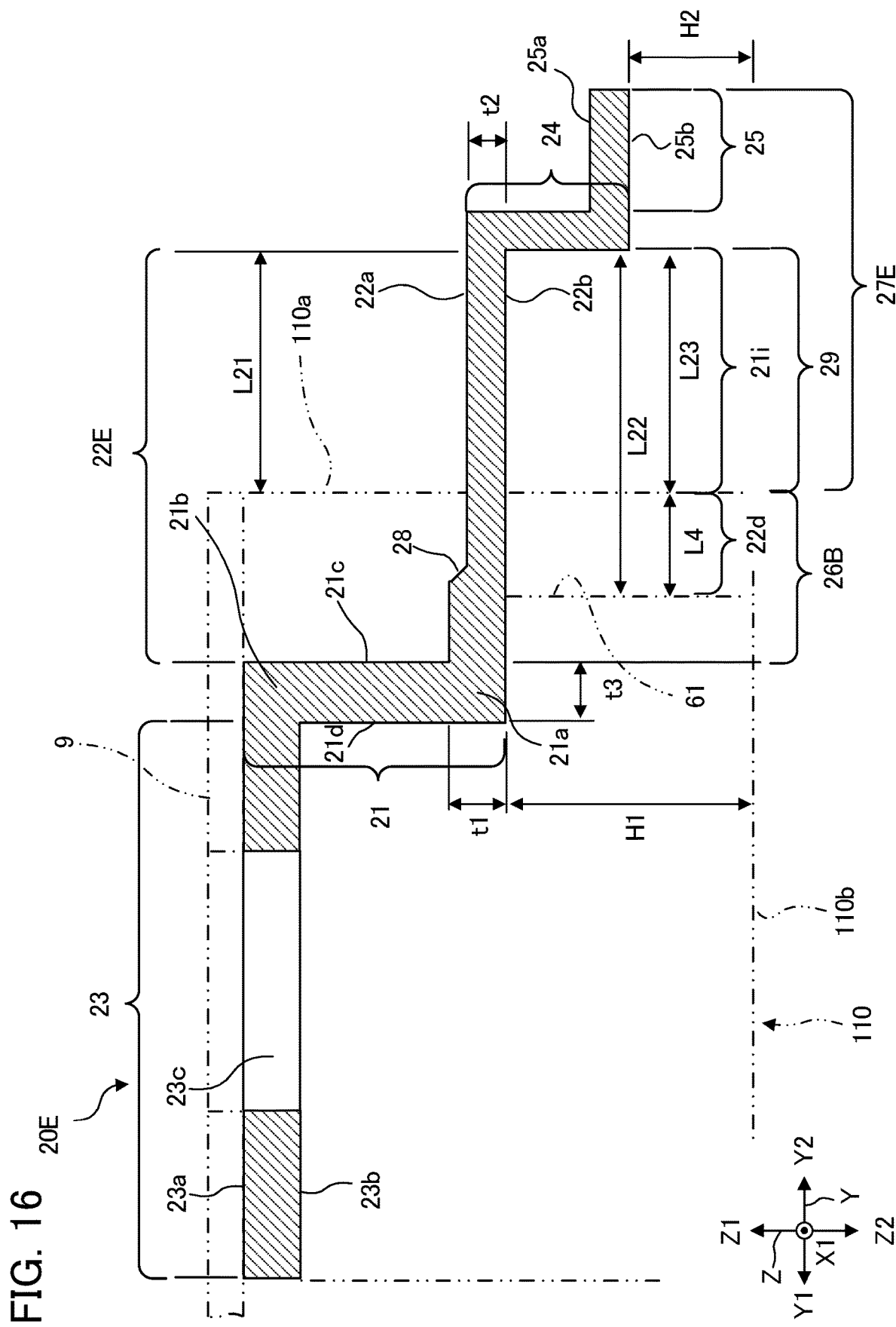
FIG. 16 is a cross-sectional view illustrating an external connection terminal shown in FIG. 15.

Next, with reference to FIGS. 15 and 16, a semiconductor package 100E according to a fourth embodiment will be described. FIG. 15 is a cross-sectional view illustrating a part of the semiconductor package 100E according to the fourth embodiment. FIG. 16 is a cross-sectional view illustrating an external connection terminal shown in FIG. 15. The semiconductor package 100E according to the fourth embodiment includes external connection terminals 20E each having a crank structure in a protruding part 27E instead of the external connection terminals 20B. In this regard, the semiconductor package 100E differs from the semiconductor package 100B according to the second embodiment. In the description of the semiconductor package 100E, description similar to that for the semiconductor packages 100, 100B and 100D is omitted.

The external connection terminal 20E includes the first piece 21, a second piece 22E, the third piece 23, a bending piece 24, and a connection piece 25. The second piece 22E extends from the first piece 21 along the Y2 direction. The bending piece 24 extends from the second piece 22 along the Z2 direction. The plate thickness direction of the bending piece 24 is along the Y2 direction. The connection piece 25 extends from the bending piece 24 along the Y2 direction. The plate thickness direction of the connection piece 25 is along the Z2 direction. The connection piece 25 includes a first surface 25a, and a second surface 25b that is spaced apart from the first surface 25a in the Z-axis direction. The first surface 25a is an upper surface, and the second surface 25b is a lower surface. The second surface 25b is joined to the metal layer 403 of the laminated substrate 400. The connection piece 25 of the external connection terminal 20E is electrically connected to the semiconductor chip 4 via the metal layer 403.

The external connection terminal 20E includes the base part 26B and the protruding part 27E. The protruding part 27E includes a main part 29 in addition to the bending piece 24 and the connection piece 25. The second piece 22E includes the base part 26B and the main part 29. The main part 29 is a part of the second piece 22E, and protrudes from the inner wall 110a in the Y2 direction. The bending piece 24 extends in the Z2 direction on the opposite side from the step part 28. The connection piece 25 extends from the bending piece 24 to the side opposite from the base part 26B (in the Y2 direction). The second surface 25b of the connection piece 25 includes a connection surface electrically connected to the semiconductor chip 4. The second surface 25b of the connection piece 25 is joined to the metal layer 403 of the laminated substrate 400 that is a part serving as a connection counterpart.

In the Y2 direction, the length L22 of the second surface 22b of the second piece 22E exposed from the enclosure 110 is longer than the length L21 of the first surface 22a of the second piece 22E exposed from the enclosure 110. The second surface 22b of the second piece 22B includes a first part 22i formed in the protruding part 27B, and a second part 22d formed in the base part 26B and exposed by the recessed part 60. In the Y2 direction, the length L23 of the first part 22i of the second surface 22b is longer than the length L4 of the second part 22d of the second surface 22b.

In the Z-axis direction, the second surface 22b of the second piece 22E and the second surface 25b of the connection piece 25 are disposed in different positions. In the Z2 direction, the height H1 from the bottom surface 110b of the enclosure 110 to the second surface 22b of the second piece 22E is greater than the height H2 from the bottom surface 110b to the connection piece 25.

Effects similar to those of the semiconductor packages 100 and 100B are also exhibited in the semiconductor package 100E according to the fourth embodiment as above. The semiconductor package 100E enables the external connection terminal 20E and the metal layer 403 of the laminated substrate 400 to be joined to each other without the intervention of the internal connection terminal 441.

Fifth Embodiment

Figure 17:
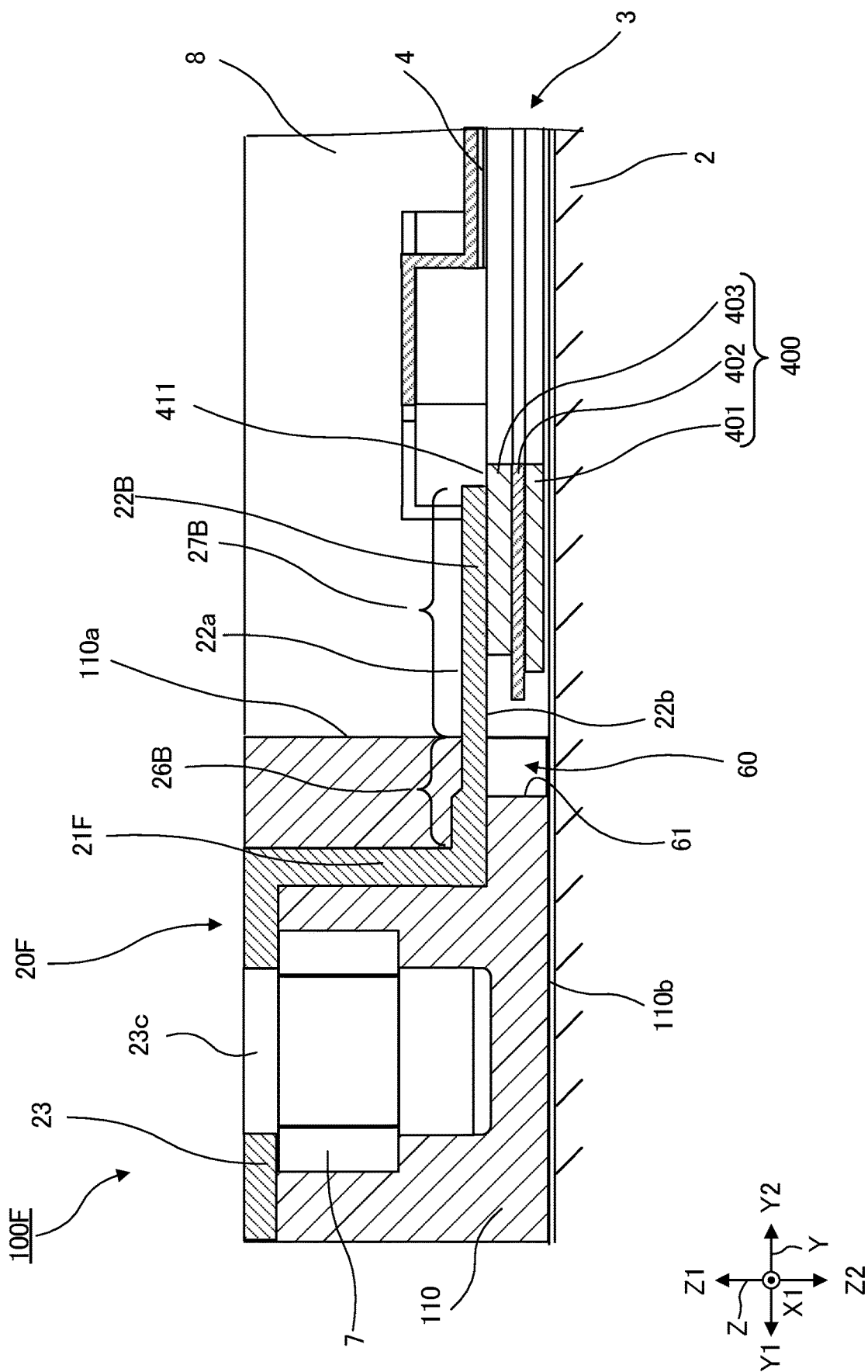
FIG. 17 is a cross-sectional view illustrating a part of a semiconductor package according to a fifth embodiment.

Next, with reference to FIG. 17, a semiconductor package 100F according to a fifth embodiment will be described. FIG. 17 is a cross-sectional view illustrating a part of the semiconductor package 100F according to the fifth embodiment. The semiconductor package 100F according to the fifth embodiment includes external connection terminals 20F instead of external connection terminals 20B, but it does not include internal connection terminals 441. In this regard, the semiconductor package 100F differs from the semiconductor package 100B. In the description of the semiconductor package 100E, description similar to that for the semiconductor packages 100 and 100B described above is omitted.

An external connection terminal 20F has a first piece 21F, the second piece 22B, and the third piece 23. The first piece 21F is long in the Z2 direction as compared to the first piece 21 of the external connection terminal 20B according to the second embodiment. The second piece 22B is bent from the first piece 21F and extends in the Y2 direction. The second piece 22B is disposed closer to the metal layer 403 of the laminated substrate 400 in the Z2 direction, as compared to the second piece 22B of the external connection terminal 20B according to the second embodiment.

The recessed part 60 of the semiconductor package 100F is short in the Z2 direction, as compared to the recessed part 60 of the semiconductor package 100B.

Effects similar to those of the semiconductor packages 100 and 100B described above are also exhibited in the semiconductor package 100F according to the fifth embodiment. The semiconductor package 100F enables the external connection terminal 20F and the metal layer 403 of the laminated substrate 400 to be joined to each other without the intervention of the internal connection terminal 441.

Sixth Embodiment

Figure 18:
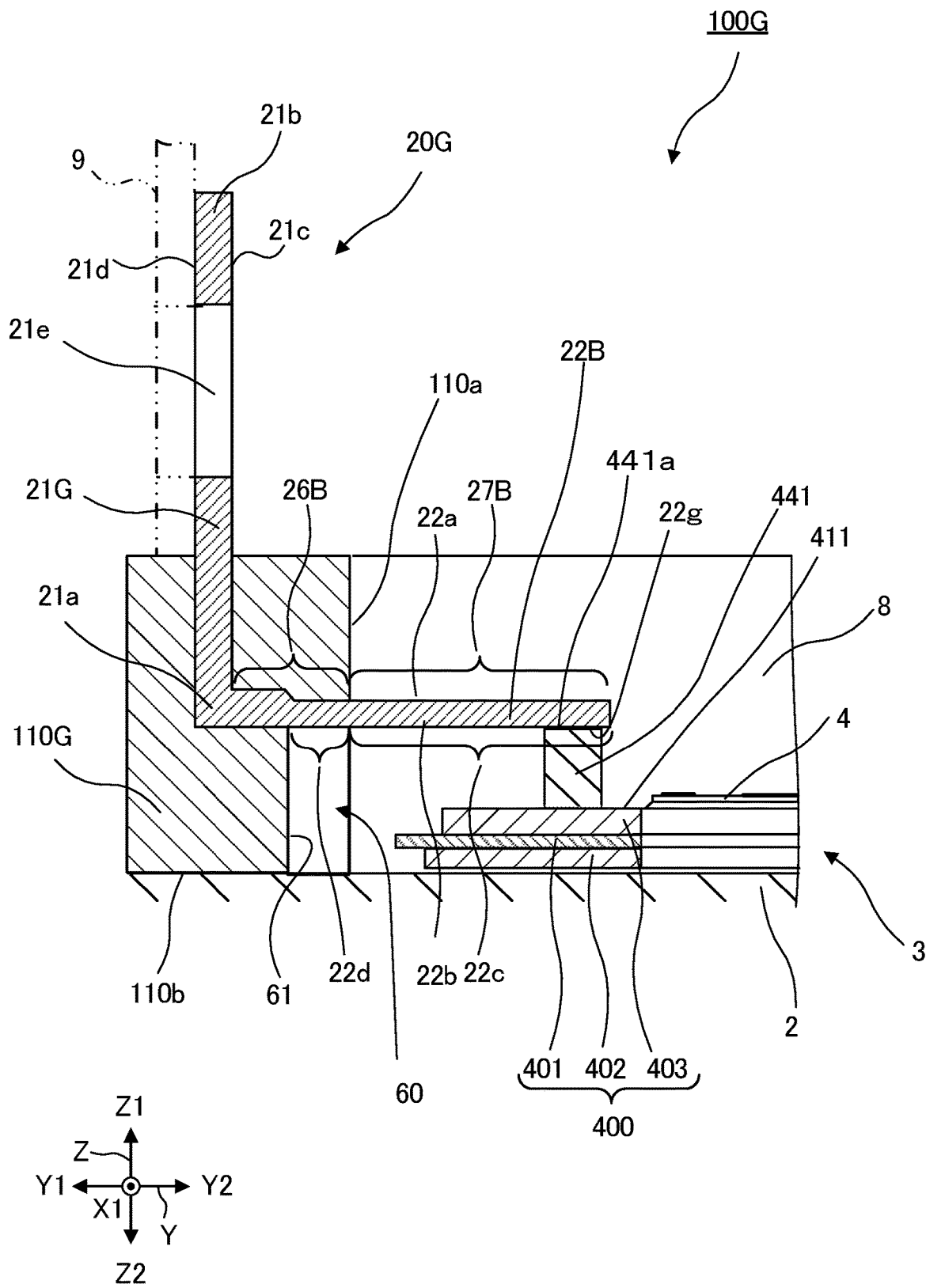
FIG. 18 is a cross-sectional view illustrating a part of a semiconductor package according to a sixth embodiment.

Next, with reference to FIG. 18, a semiconductor package 100G according to a sixth embodiment will be described. FIG. 18 is a cross-sectional view illustrating a part of the semiconductor package 100G according to the sixth embodiment. The semiconductor package 100G according to the sixth embodiment includes external connection terminals 20G instead of the external connection terminals 20B. In this regard, the semiconductor package 100G differs from the semiconductor package 100B according to the second embodiment. In the description of the semiconductor package 100G, description similar to that of the semiconductor packages 100 and 100B described above is omitted.

The external connection terminal 20G has a first piece 21G and the second piece 22B. The first piece 21G is long in the Z1 direction, as compared to the first piece 21 of the external connection terminal 20B according to the second embodiment. The first piece 21F protrudes from the top surface 110d of the enclosure 110 in the Z1 direction. The top surface 110d is spaced apart from the bottom surface 110b in the Z2 direction. An upper end 21b of the first piece 21F is positioned in the Z1 direction of the top surface 110d.

The external terminal 9 is connected to the first piece 21G. The first piece 21G has an opening 21e in the Y2 direction. A bolt (not shown) is inserted in the opening 21e, and the external terminal 9 is connected to the first piece 21.

The enclosure 110 of the semiconductor package 100G is short in the Y2 direction, as compared to the enclosure 110 of the semiconductor package 100B.

Effects similar to those of the semiconductor packages 100 and 100B described above are also exhibited in the semiconductor package 100G according to the sixth embodiment as above. The semiconductor package 100G enables the enclosure 110 to be shortened in the Y2 direction and enables space to be saved.

Seventh Embodiment

Figure 19:
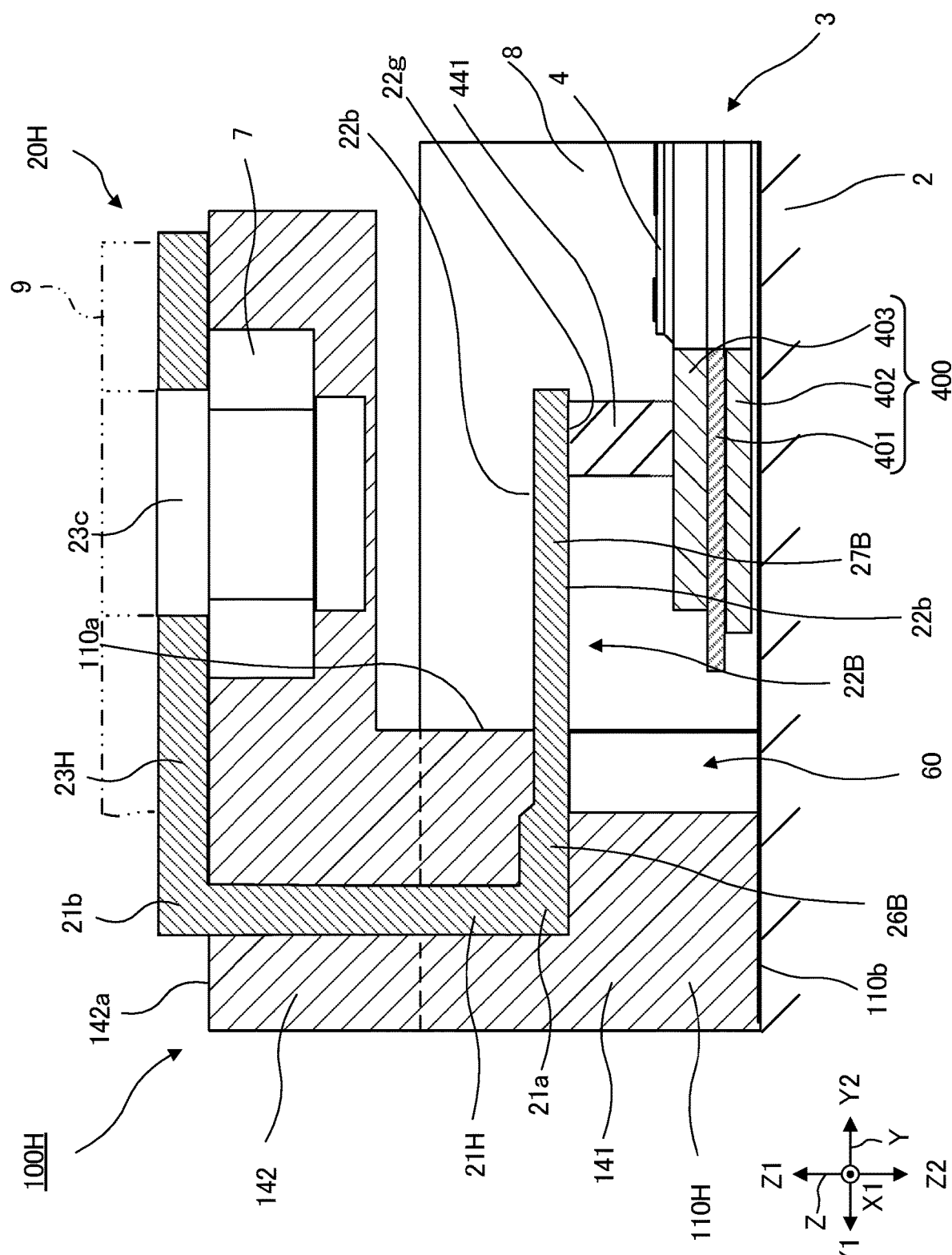
FIG. 19 is a cross-sectional view illustrating a part of a semiconductor package according to a seventh embodiment.

Next, with reference to FIG. 19, a semiconductor package 100H according to a seventh embodiment will be described. FIG. 19 is a cross-sectional view illustrating a part of the semiconductor package 100H according to the seventh embodiment. The semiconductor package 100H according to the seventh embodiment includes external connection terminals 20H instead of the external connection terminals 20B. Furthermore, the semiconductor package 100H includes an enclosure 110H instead of the enclosure 110. In this regard, the semiconductor package 100H differs from the semiconductor package 100B according to the second embodiment. In the description of the semiconductor package 100H, description similar to that of the semiconductor packages 100 and 100B described above is omitted.

The enclosure 110H includes a body 141 and an upper stage part 142. The body 141 is rectangular, and it houses the semiconductor unit 3. The upper stage part 142 extends from the body 141 in the Z1 direction and in the Y2 direction. The upper stage part 142 is formed in a part corresponding to an external connection terminal 20H when seen from the Z-axis.

The external connection terminal 20H has a first piece 21H, a second piece 22B, and a third piece 23H. The first piece 21H is long in the Z1 direction as compared to the first piece 21 of the external connection terminal 20B according to the second embodiment. The upper end 21b of the first piece 21H extends from the top surface 142a of the upper stage part 142 of the enclosure 110H along the Z1 direction. The top surface 142a is an upper surface of the upper stage part 142. The upper end 21b of the first piece 21H is positioned in the Z1 direction of the top surface 142a.

The third piece 23H extends from the first piece 21 along the Y2 direction. The plate thickness direction of the third piece 23H is along the Z2 direction. The third piece 23H is disposed along the top surface 142a. The third piece 23H has the opening 23c in the plate thickness direction. In the upper stage part 142, the nut 7 is embedded at a position corresponding to the opening 23c.

The enclosure 110H of the semiconductor package 100H is short in the Y2 direction, as compared to the enclosure 110 of the semiconductor package 100B.

Effects similar to those of the semiconductor packages 100 and 100B described above are also exhibited in the semiconductor package 100H according to the seventh embodiment. The semiconductor package 100H enables the enclosure 110 to be shortened in the Y2 direction and enables space to be saved.

Eighth Embodiment

Figure 20:
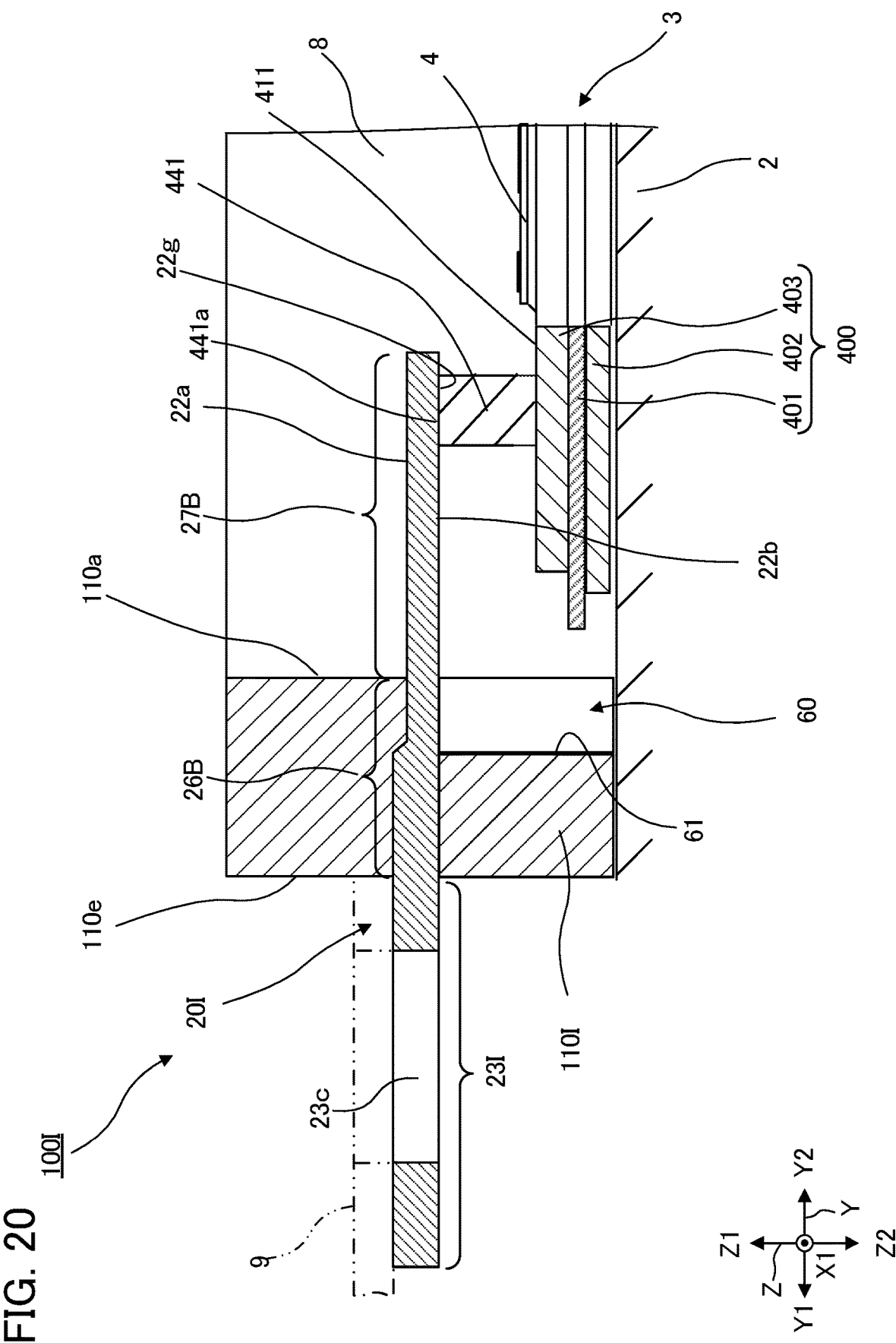
FIG. 20 is a cross-sectional view illustrating a part of a semiconductor package according to an eighth embodiment.

Next, with reference to FIG. 20, a semiconductor package 100I according to an eighth embodiment will be described. FIG. 20 is a cross-sectional view illustrating a part of the semiconductor package 100I according to the eighth embodiment. The semiconductor package 100I according to the eighth embodiment includes external connection terminals 20I instead of the external connection terminals 20B. Furthermore, the semiconductor package 100I includes an enclosure 110I instead of the enclosure 110. In this regard, the semiconductor package 100I differs from the semiconductor package 100B according to the second embodiment. In the description of the semiconductor package 100I, description similar to that of the semiconductor packages 100 and 100B described above is omitted.

The external connection terminal 20I includes a base part 26B, a protruding part 27B, and a second protruding part 23I. The external connection terminal 20I is flat-shaped. The second protruding part 23I is continuous with the base part 26B. The second protruding part 23I protrudes from an outer wall surface 110e of the enclosure 110I in the Y1 direction. The enclosure 110I of the semiconductor package 100I is short in the Y2 direction, as compared to the enclosure 110 of the semiconductor package 100B.

Effects similar to those of the semiconductor packages 100 and 100B are also exhibited in the semiconductor package 100I according to the eighth embodiment. The semiconductor package 100I enables the enclosure 110 to be shortened in the Y2 direction, and enables space to be saved.

Manufacturing Method

Figure 21:
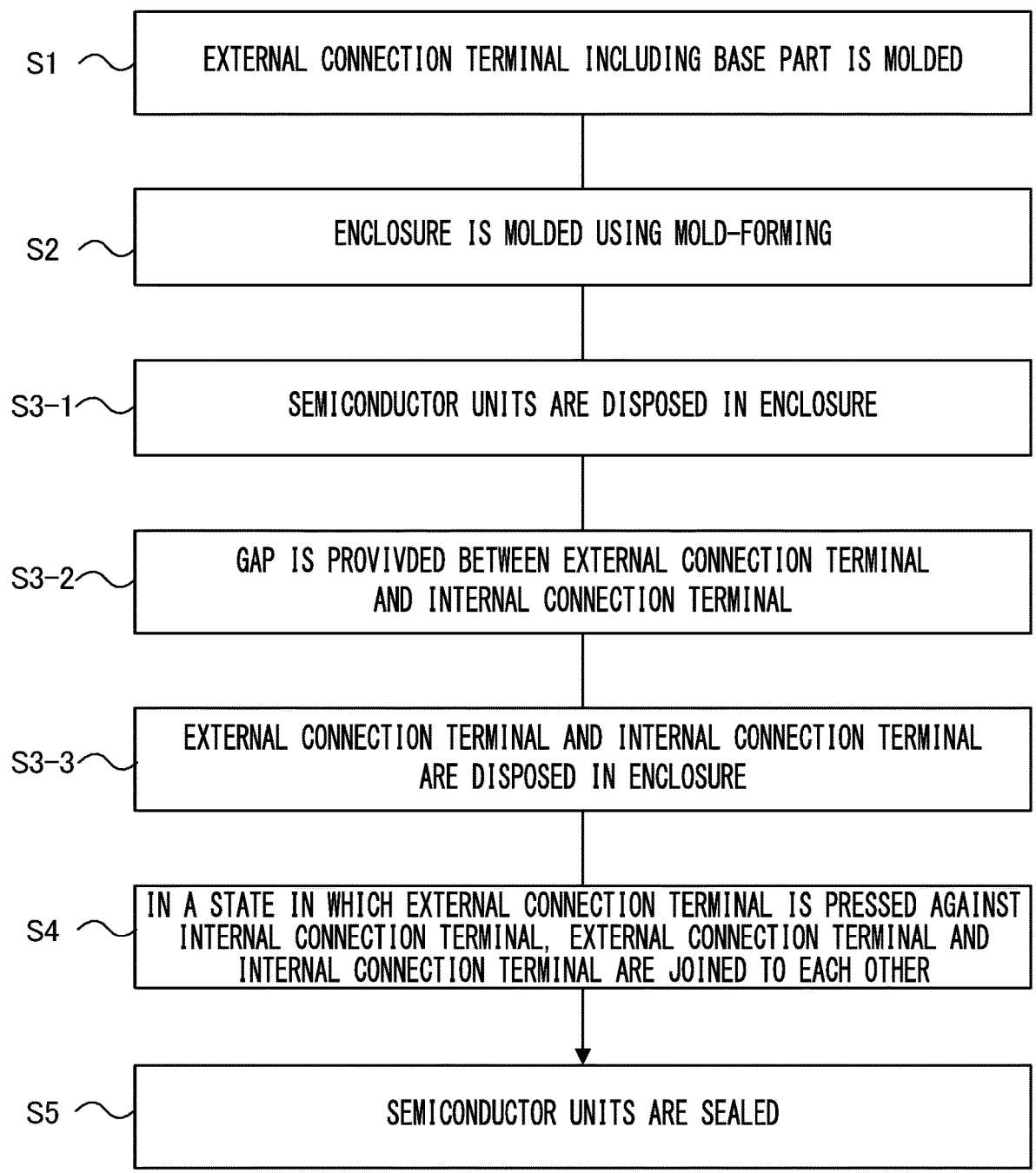
FIG. 21 is a flowchart illustrating procedures in a manufacturing method of the semiconductor package.
Figure 22:
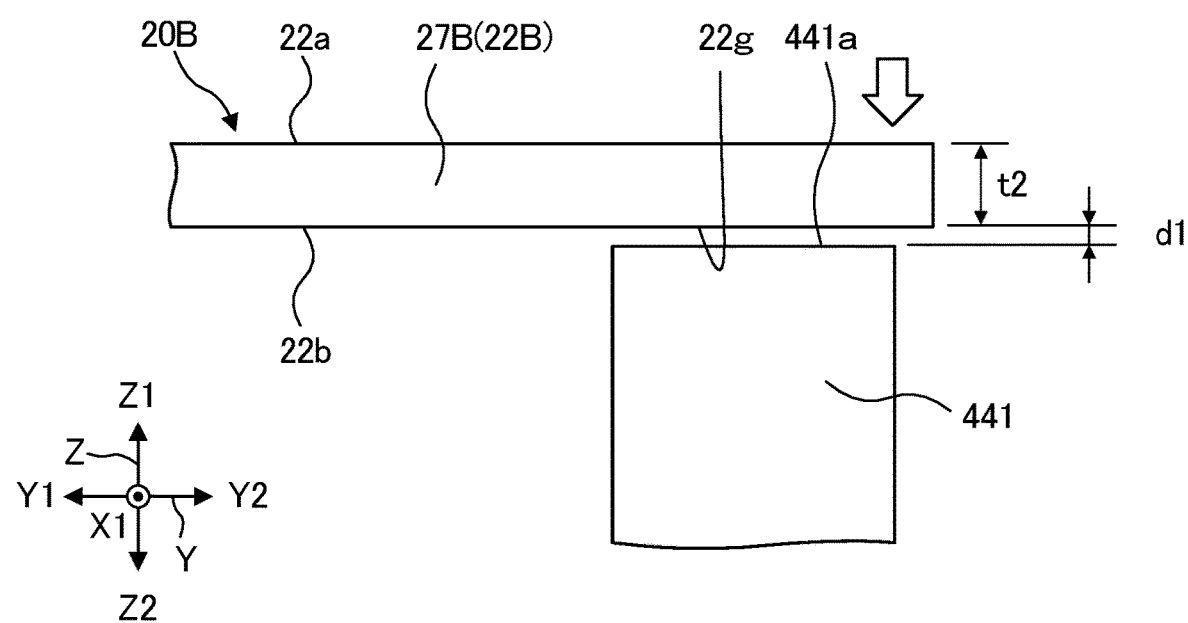
FIG. 22 is a view illustrating a gap between the external connection terminal and an internal connection terminal.

Next, a manufacturing method for the semiconductor package will be described. Description will be given of a method for manufacturing the semiconductor package 100B illustrated in FIG. 9. Furthermore, attention will be focused on one semiconductor unit 3 for simplicity of description. FIG. 20 is a flowchart illustrating procedures in the manufacturing method of the semiconductor package 100B. FIG. 21 is a view illustrating a gap d1 between external connection terminal 20B and internal connection terminal 441.

As illustrated in FIG. 20, in the manufacturing method of the semiconductor package 100B, the external connection terminal 20B including the step part 28 is molded by press working (S1). Specifically, a plate material to be used for forming the external connection terminal 20B is prepared, and the plate material is placed in a molding die. By the press working, the plate material is bent to form the first piece 21, the second piece 22, and the third piece 23. As a result, the external connection terminal 20B shown in FIGS. 10 to 12 is formed. Furthermore, the step part 28 is molded in the first surface 22a of the second piece 22 by the press working. The same press working is applied to the external connection terminals 30 and 40.

Next, the enclosure 110 is molded by mold-forming (S2). Specifically, the molding die has convex portions opposing the recessed parts 60. The external connection terminal 20B is disposed in the molding die, and the molding die is filled with insulating resin. By this mold-forming, the enclosure 110, in which the base part 26B of the external connection terminal 20B is embedded in the enclosure 110 and the recessed part 60 is formed, is molded. That is, the enclosure 110 with the external connection terminal 20B and the insulating resin in one piece is manufactured. Similar to the external connection terminal 20B, the connection terminals 30 and 40 are integrated with the enclosure 110.

Furthermore, the recessed parts 70 and 80 are provided in positions of the enclosure 110 corresponding to the external connection terminals 30 and 40.

Next, the semiconductor units 3 are disposed in the enclosure 110 (S3-1). As illustrated in FIG. 9, the cooling device 2 is fixed to the enclosure 110, and the semiconductor unit 3 is fixed to the cooling device 2. As illustrated in FIG. 21, the positions of the external connection terminal 20B and the internal connection terminal 441 are determined. At this time, the gap d1 is provided between the external connection terminal 20B and the internal connection terminal 441 (an example of a component part) to be joined thereto (S3-2). The connection surface 22g of the external connection terminal 20B and the top surface 441a of the internal connection terminal 441 are not in contact with each other and are spaced apart from each other in the Z2 direction. The gap d1 is a gap between the connection surface 22g of the second piece 22B and the top surface 441a of the internal connection terminal 441 in the Z2 direction. The gap d1 may be 1% or more and 100% or less of the thickness t2 of the second piece 22B. The gap d1 is preferably 5% or more and 20% or less of the thickness t2 of the second piece 22B. Next, the external connection terminal 20B and the internal connection terminal 441 are disposed in the enclosure 110 (S3-3).

Next, in a state in which the protruding part 27B of the external connection terminal 20B is pressed against the internal connection terminal 441, the external connection terminal 20B and the internal connection terminal 441 are joined to each other (S4). Specifically, in a state in which the first surface 22a of the second piece 22B is pressed, a part of the metal plate (busbar) corresponding to the second piece 22B is bent. As a result, the connection surface 22g of the second piece 22B approaches the top surface 441a of the internal connection terminal 441. In the state in which the connection surface 22g and the top surface 441a are in contact with each other, the external connection terminal 20B and the internal connection terminal 441 are joined to each other. Examples of the joining method include laser welding, soldering, and ultrasonic joining. The joining method is freely selectable as long as heat resistance and high joining strength are obtainable. The same joining is applied to the external connection terminals 30 and 40.

Next, the sealing part 8 is formed in the enclosure 110, and the semiconductor units 3 are sealed (Step S5). As a result, the external connection terminals 20B exposed from the enclosure 110 are sealed by the sealing part 8 together with the semiconductor units 3. As with the external connection terminal 20B, the external connection terminals 30, 40 are sealed by the sealing part 8.

In the manufacturing method according to the present embodiment, the external connection terminal 20B is joined to the internal connection terminal 441 by pressing the second piece 22B of the external connection terminal 20B against the internal connection terminal 441. It is easy to bend a part of the metal plate corresponding to the second piece 22B because the recessed part 60 is formed in the enclosure 110. For this reason, the compressive stress generated in the enclosure 110 due to the action of the reaction force from the second piece 22B is reduced. Furthermore, the protruding part 27B is pressed against the internal connection terminal 441, which enables the action of the reaction force that acts on the external connection terminal 20B to be reduced, and enables the concentration of stress generated in the enclosure 110 to be alleviated. Furthermore, the residual stress in the external connection terminal 20 is reduced after the manufacturing of the semiconductor package 100B.

For example, if the dimensional tolerance, and the assembly tolerance of each of the parts (e.g., the enclosure 110, the external connection terminal 20 and the semiconductor units 3) are large, there may be incomplete contact between the external connection terminal 20 and the internal connection terminal 441. However, in the manufacturing method according to the present embodiment, the gap d1 is provided between the external connection terminal 20B and the internal connection terminal 441. Thereafter, both are joined together in a state in which the protruding part 27B is pressed against the internal connection terminal 441. As a result, the protruding part 27B and the internal connection terminal 441 are joined to each other in a state in which the protruding part 27B and the internal connection terminal 441 are in close contact with each other such that the dimensional tolerance and the assembly tolerance are reduced. As a result, the joining strength between the external connection terminal 20B and the internal connection terminal 441 is improved.

As illustrated in FIG. 12, in the external connection terminal 20B, the step part 28 is provided in the first surface 22a of the second piece 22B. Accordingly, it is easy to bend a part of the metal corresponding to the second piece 22B toward the opposite side from the step part 28 (in the Z2 direction). For this reason, the connection surface 22g is joined to the top surface 441a of the internal connection terminal 441, in a state in which both are in close contact with each other. As a result, joining strength is improved.

In the manufacturing method according to the present embodiment, a case has been described in which the semiconductor package 100B is manufactured. However, the manufacturing method according to the present embodiment may be applied to other semiconductor packages 100.

Ninth Embodiment

Figure 23:
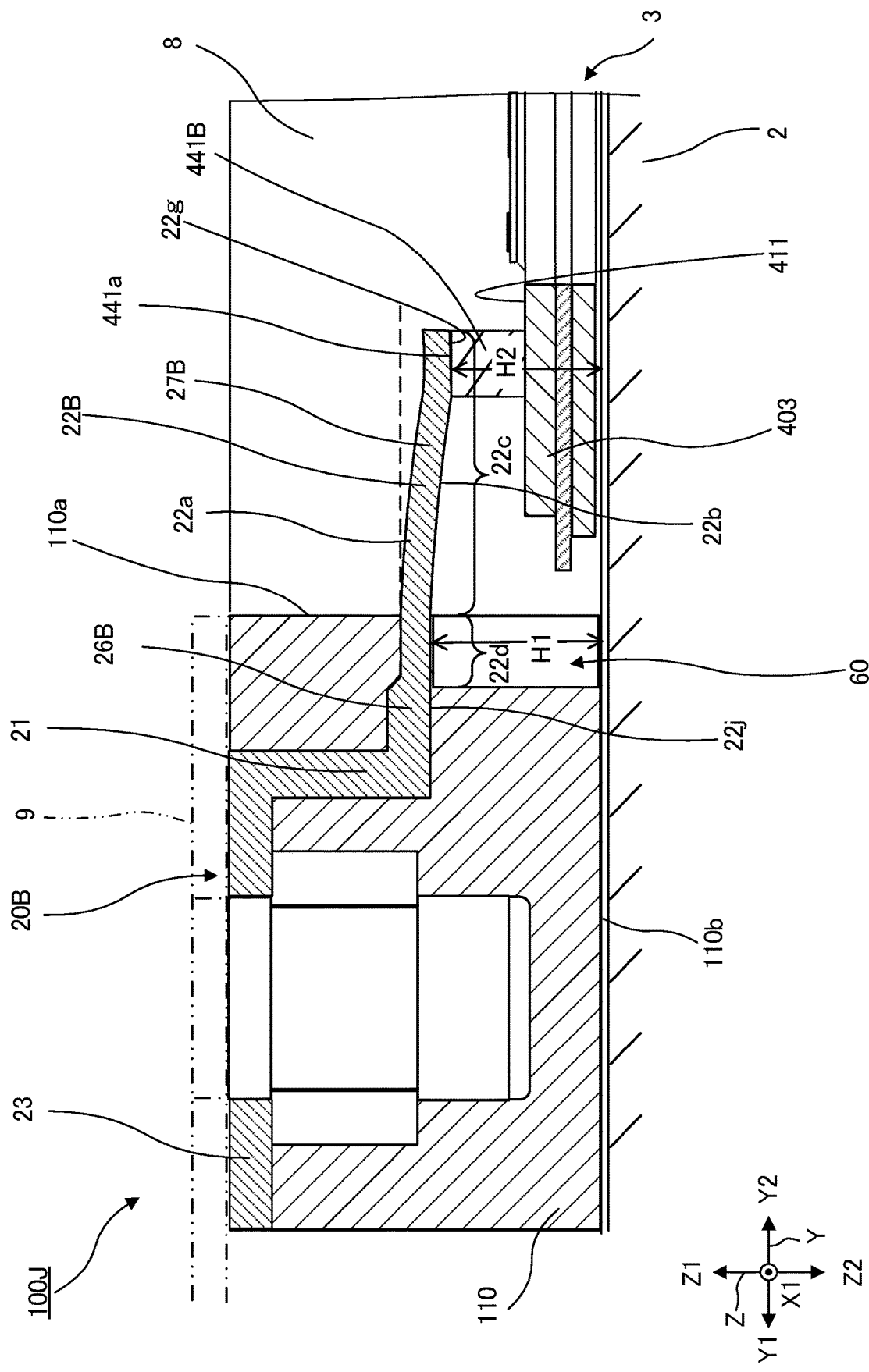
FIG. 23 is a cross-sectional view illustrating a part of a semiconductor package according to a ninth embodiment.

Next, with reference to FIG. 23, a semiconductor package 100J according to a ninth embodiment will be described. FIG. 23 is a cross-sectional view illustrating a part of the semiconductor package 100J according to the ninth embodiment.

The semiconductor package 100J according to the ninth embodiment includes internal connection terminals 441B instead of the internal connection terminals 441. Furthermore, the protruding parts 27B of the external connection terminals 20B are warped. In this regard, the semiconductor package 100J differs from the semiconductor package 100B. In the description of the semiconductor package 100J, description similar to that of the semiconductor packages 100 and 100B is omitted.

The internal connection terminal 441B is shorter than the internal connection terminal 441 in the Z2 direction. The top surface 441a of the internal connection terminal 441B is opposite the first surface 22a of the base part 26.

The connection surface 22g of the protruding part 27B of the external connection terminal 20B is joined to the top surface 441a of the internal connection terminal 441B. The protruding part 27B is warped in the Z2 direction. The Z2 direction is one example of a direction heading toward the second surface from the first surface of the protruding part.

The connection surface 22g is positioned in the Z2 direction of the second surface 22j of the base part 26B.

The height H1 from the bottom surface 110b of the enclosure 110 to the second surface 22j of the base part 26B is greater than the height H2 from the bottom surface 110b to the connection surface 22g, in the Z2 direction. Here, the height H1 can also be called "the height H1 from the second part 22d corresponding to the base part 26B." The height H1 is one example of a first height, and the height H2 is one example of a second height.

Effects similar to those of the semiconductor packages 100 and 100B described above are also exhibited in the semiconductor package 100J according to the ninth embodiment. In the semiconductor package 100J, the recessed parts 60 are formed in the enclosure 110, and therefore, it is easy to bend the external connection terminals 20B and the protruding parts 27B. In the semiconductor package 100J, the connection surface 22g is easily joined to the top surface 441a of the internal connection terminal 441B by warping the protruding part 27B. In the semiconductor package 100J, the connection surface 22g of the protruding part 27B is disposed in a position close to the bottom surface 110b of the enclosure 110 in the Z2 direction.

The semiconductor package 100J includes the recessed parts 60. This enables the stress generated in the enclosure 110 due to the action of the reaction force from the external connection terminals 20B to be reduced in a state in which the protruding parts 27B are warped.

Next, with reference to FIG. 24, a recessed part 60E according to a modification will be described. FIG. 24 is a cross-sectional view illustrating a part of the enclosure 110 including the recessed part 60E according to a modification.

The wall surface 64E that defines the position of the upper side of the recessed part 60E is disposed in the same position as the first surface 22a of the second piece 22 of the external connection terminal 20 in the Z2 direction. Furthermore, there is a gap between the side surfaces 22e and 22f of the second piece 22 and the wall surfaces 62 and 63. In this regard, the recessed part 60E illustrated in FIG. 24 differs from that illustrated in FIG. 5. The recessed parts 60E may be formed in the enclosure 110.

The wall surface 64E may be disposed between the first surface 22a and the second surface 22b of the second piece 22 in the Z-axis direction. The wall surface 62 may be formed so as to be in contact with the side surface 22e of the second piece 22, or it may be formed so as to be spaced apart from the side surface 22e. Similarly, the wall surface 63 may be formed so as to be in contact with the side surface 22f of the second piece 22, or it may be formed so as to be apart from the side surface 22f.

The abovementioned examples merely illustrate representative forms of the present disclosure. The present disclosure is not limited to the abovementioned examples, and various changes and additions can be made without departing from the gist of the present disclosure.

In the semiconductor package 100 described above, a component part (specifically, the internal connection terminal 441) that is to be joined is disposed in the Z2 direction of the protruding part 27 of the external connection terminal 20. Furthermore, the recessed part 60 is disposed in the Z2 direction of the base part 26. However, the arrangement of the component part and the recessed part 60 is not limited thereto. For example, the component part (specifically, the internal connection terminal 441) may be disposed in the Z1 direction of the protruding part 27, and the recessed part 60 may be disposed in the Z1 direction of the base part 26. In the abovementioned embodiment, the internal connection terminal 441 and the laminated substrate 400 are exemplified as the component parts that are connected to the external connection terminal 20, but these component parts that are connected to the external connection terminal 20 are not limited thereto. The component parts may be electric conductors. The external connection terminal 20 may be indirectly connected to the main electrode of the semiconductor chip 4A via other members, or it may be directly connected to the main electrode of the semiconductor chip 4A.

In the abovementioned embodiment, the modifications for the external connection terminal 20 and the recessed part 60 are mainly exemplified, but the same applies to the other external connection terminals 30 and 40, and recessed parts 60 and 70. In the semiconductor package 100 described above, a configuration has been described in which the recessed parts 60, 70 and 80 are provided for the external connection terminals 20, 30 and 40, respectively. However, at least one recessed part may be formed in the semiconductor package 100.

In the abovementioned form, a configuration has been described in which the semiconductor chips 4A and 4B each include a RC-IGBT. However, this configuration is not limited to the exemplifications above. For example, the semiconductor chips 4A and 4B may each include an IGBT or a MOSFET. In this case, the main electrode C is a source electrode, and the main electrode E is a drain electrode. Alternatively, the main electrode C is the drain electrode, and the main electrode E is the source electrode. The number of the semiconductor chips 4A and 4B included in the semiconductor unit 3 is not limited to two. For example, the semiconductor units 3 may include one, or three, or more of the semiconductor chips 4A and 4B.

In the abovementioned embodiment, a configuration has been described in which the semiconductor package 100 includes three of the semiconductor units 3, but the number of the semiconductor units 3 is not limited to three. For example, the semiconductor package 100 may include one, or three, or four, or more of the semiconductor units 3.

DESCRIPTION OF REFERENCE SIGNS 100, 100B, 100D, 100E, 100F, 100G, 100H, 100I, 100J . . . semiconductor package, 4A, 4B . . . semiconductor device, 9 . . . external terminal, 20, 20B, 20C, 20E, 20F, 20G, 20H, 20I . . . external connection terminal, 21, 21F, 21H . . . first piece, 21c . . . first surface of first piece, 21d . . . second surface of first piece, 22, 22B, 22C, 22E . . . second piece, 22a . . . first surface of second piece, 22b . . . second surface of second piece, 22c . . . first part, 22d . . . second part, 22g . . . connection surface, 22j . . . second surface, 23 . . . third piece, 24 . . . bending piece, 25 . . . connection piece, 25b . . . connection surface, 26, 26B . . . base part, 27, 27B, 27E . . . protruding part, 28, 28C . . . step part, 28a . . . inclined surface, 29 . . . main part, 30 . . . external connection terminal, 40 . . . external connection terminal, 60, 60E . . . recessed part, 61, 61D . . . wall surface, 70 . . . recessed part, 80 . . . recessed part, 110, 110H, 110I . . . enclosure, 110a . . . inner wall, 121, 122 . . . extending part, 123 . . . extending part, 124 . . . extending part, 125 . . . extending part, 131 . . . receiving part, H1 . . . height, H2 . . . height, L1 . . . length, L2, L12 . . . length, d1 . . . gap, t1 . . . thickness, t2 . . . thickness

What is claimed is:

1. A semiconductor apparatus comprising:
a semiconductor device;
a first external connection terminal configured to be connected to the semiconductor device, the first external connection terminal including a first surface and a second surface opposing the first surface; and
an insulating resin enclosure including:
an inner wall that defines a space for housing the semiconductor device and is along a first direction that is directed from the first surface to the second surface;
a first recessed part that exposes the second surface of the first external connection terminal;
a first extending part that defines the first recessed part; and
a second extending part that defines the first recessed part and is spaced apart from the first extending part along a third direction that is along a width direction of the first external connection terminal,
wherein:
the first external connection terminal includes:
a base part that is embedded in the insulating resin enclosure; and
a protruding part that protrudes from the inner wall of the insulating resin enclosure,
the second surface of the first external connection terminal includes:
a first part that corresponds to the protruding part; and
a second part that corresponds to the base part and is exposed by the first recessed part,
the first part and the second part are continuous with each other along a second direction in which the protruding part of the first external connection terminal protrudes,
the first and second extending parts are spaced apart from each other in the third direction, and
each of the first and second extending parts extends along the first direction from a position corresponding to the second surface of the first external connection terminal.

2. The semiconductor apparatus according to claim 1, wherein:
the base part of the first external connection terminal includes a step part in which a thickness of the base part is changed from a first thickness to a second thickness,
the second thickness is thinner than the first thickness, and
the protruding part of the first external connection terminal has the second thickness.

3. The semiconductor apparatus according to claim 2, wherein:
the first part of the second surface includes a connection surface electrically connected to the semiconductor device, and
the step part is positioned at the first surface.

4. The semiconductor apparatus according to claim 1, wherein:
the protruding part of the first external connection terminal includes:
a main part that extends along the second direction and is continuous with the base part;
a bending piece that extends from the main part along the first direction; and
a connection piece that extends from the bending piece along the second direction; and
the connection piece includes a connection surface electrically connected to the semiconductor device.

5. The semiconductor apparatus according to claim 1, wherein:
the second surface corresponding to the first part includes a connection surface electrically connected to the semiconductor device;
the protruding part is warped along the first direction that is directed the first surface to the second surface of the first external connection terminal;
the insulating resin enclosure further includes a bottom surface spaced apart from the second surface of the first external connection terminal, and
a first height from the bottom surface to the second part corresponding to the base part is greater than a second height from the bottom surface to the connection surface, in the first direction.

6. The semiconductor apparatus according to claim 3, wherein:
the step part includes an inclined surface inclined to the first surface of the protruding part; and
an angle formed by the inclined surface of the step part and the first surface of the protruding part is an obtuse angle.

7. The semiconductor apparatus according to claim 1, wherein:
the first external connection terminal further includes:
a first piece that is embedded in the insulating resin enclosure and extends along the first direction; and
a second piece that extends from the first piece along the second direction, and
the second piece includes the base part and the protruding part.

8. The semiconductor apparatus according to claim 7, wherein:
the first external connection terminal further includes a third piece that extends from the first piece to an opposite side from the second piece, and
the third piece is configured to be connected to an external terminal.

9. The semiconductor apparatus according to claim 7, wherein:
the first piece of the first external connection terminal includes:
a first surface; and
a second surface opposing the first surface of the first piece,
the first surface of the first piece is closer to the protruding part than the second surface of the first piece in the second direction,
the insulating resin enclosure further includes a wall surface that defines the first recessed part in the second direction, and
the wall surface is closer to the protruding part than the second surface of the first piece.

10. The semiconductor apparatus according to claim 9, wherein the wall surface of the insulating resin enclosure is closer to the protruding part than the first surface of the first piece.

11. The semiconductor apparatus according to claim 10, wherein:
the base part of the first external connection terminal includes a step part in which a thickness of the base part is changed from a first thickness to a second thickness,
the second thickness is thinner than the first thickness, and
the wall surface of the insulating resin enclosure is disposed at a position corresponding to the step part.

12. The semiconductor apparatus according to claim 7, wherein a length of a part that corresponds to the second piece and that is a part of the second surface is longer than a length of a part that corresponds to the second piece and that is a part of the first surface of the first external connection terminal, in the second direction.

13. The semiconductor apparatus according to claim 1, wherein in the second surface of the first external connection terminal along the second direction, a length of the first part corresponding to the protruding part is longer than a length of the second part corresponding to the base part.

14. The semiconductor apparatus according to claim 1, further comprising:
a second external connection terminal; and
a third external connection terminal that is spaced apart from the second external connection terminal in the third direction,
wherein the second external connection terminal includes at least:
a first surface;
a second surface opposing the first surface of the second external connection terminal; and
a base part embedded in the insulating resin enclosure, the third external connection terminal includes at least:
a first surface;
a second surface opposing the first surface of the third external connection terminal; and
a base part embedded in the insulating resin enclosure, wherein the insulating resin enclosure further includes:
a second recessed part that exposes the second surface of the base part included in the second external connection terminal;
a third recessed part that exposes the second surface of the base part included in the third external connection terminal;
a third extending part that is positioned between the second recessed part and the third recessed part in the third direction;
a fourth extending part that is positioned apart from the third extending part in the third direction; and
a fifth extending part that is positioned apart from the third extending part in an opposite direction of the third direction.

15. The semiconductor apparatus according to claim 1, wherein:
the first external connection terminal is configured to be connected to a first external terminal,
the first external terminal is spaced apart from the first surface of the base part in an opposite direction of the first direction, and
the insulating resin enclosure further includes a first receiving part that is in contact with the first surface of the base part and is in contact with the first external terminal.

16. The semiconductor apparatus according to claim 14, wherein:
the first external connection terminal is configured to be connected to be a first external terminal,
the first external terminal is spaced apart from the first surface of the base part included in the first external connection terminal in an opposite direction of the first direction,
the second external connection terminal is configured to be connected to be a second external terminal,
the second external terminal is spaced apart from the first surface of the base part included in the second external connection terminal in the opposite direction,
the third external connection terminal is configured to be connected to be a third external terminal,
the third external terminal is spaced apart from the first surface of the base part included in the third external connection terminal in an opposite direction,
the insulating resin enclosure further includes:
a first receiving part that is in contact with the first surface of the base part included in the first external connection terminal and is in contact with the first external terminal;
a second receiving part that is in contact with the second surface of the base part included in the second external connection terminal and is in contact with the second external terminal; and
a third receiving part that is in contact with the first surface of the base part included in the third external connection terminal and is in contact with the third external terminal.

17. A manufacturing method of a semiconductor apparatus that includes:
a semiconductor device;
a first external connection terminal configured to be connected to the semiconductor device, and the first external connection terminal including a first surface and a second surface opposing the first surface; and
an insulating resin enclosure including:
an inner wall that defines a space for housing the semiconductor device and is along a first direction that is directed from the first surface to the second surface;
a first recessed part that exposes the second surface of the first external connection terminal;
a first extending part that defines the first recessed part; and
a second extending part that defines the first recessed part and is spaced apart from the first extending part along a third direction that is along a width direction of the first external connection terminal,
wherein:
the first external connection terminal includes:
a base part that is embedded in the insulating resin enclosure; and
a protruding part that protrudes from the inner wall of the insulating resin enclosure,
the second surface of the first external connection terminal includes:
a first part that corresponds to the protruding part; and
a second part that corresponds to the base part and is exposed by the first recessed part,
the first part and the second part are continuous with each other along a second direction in which the protruding part of the first external connection terminal protrudes,
the first and second extending parts are spaced apart from each other in the third direction, and
each of the first and second extending parts extends along the first direction from a position corresponding to the second surface of the first external connection terminal,
the manufacturing method comprising:
disposing the first external connection terminal in a molding die having a convex portion opposing the first recessed part, and filling the molding die with insulating resin, to mold the insulating resin enclosure in which the base part of the first external connection terminal is embedded and the first recessed part is formed, using mold-forming;

providing a gap between the first external connection terminal and a component part to be joined thereto in the first direction;

disposing the first external connection terminal and the component part in the insulating resin enclosure; and joining the first external connection terminal and the component part together in a state in which the first external connection terminal is pressed against the component part.

18. The manufacturing method of the semiconductor apparatus according to claim 17, further comprising: molding a step part in the first external connection terminal by performing press working before molding the insulating resin enclosure.

* * * * *